(12) United States Patent
Chung et al.

(10) Patent No.: US 10,516,077 B2
(45) Date of Patent: Dec. 24, 2019

(54) DISPLAY APPARATUS INCLUDING LAYERED STRUCTURES

(71) Applicant: SAMSUNG ELECTRONICS CO., LTD., Suwon-si (KR)

(72) Inventors: Chilhee Chung, Seoul (KR); Junhee Choi, Seongnam-si (KR); Sungwoo Hwang, Seoul (KR); Shinae Jun, Seongnam-si (KR); Deukseok Chung, Yongin-si (KR); Junseok Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/000,336

(22) Filed: Jun. 5, 2018

(65) Prior Publication Data

US 2018/0351035 A1 Dec. 6, 2018

Related U.S. Application Data

(60) Provisional application No. 62/515,161, filed on Jun. 5, 2017.

(30) Foreign Application Priority Data

Jun. 5, 2017 (KR) .................. 10-2017-0069526
Jul. 19, 2017 (KR) .................. 10-2017-0091719

(51) Int. Cl.
*H01L 33/06* (2010.01)
*H01L 33/32* (2010.01)
(Continued)

(52) U.S. Cl.
CPC .......... *H01L 33/06* (2013.01); *H01L 27/1255* (2013.01); *H01L 27/1262* (2013.01);
(Continued)

(58) Field of Classification Search
None
See application file for complete search history.

(56) References Cited

U.S. PATENT DOCUMENTS

| 5,789,766 A | 8/1998 | Huang et al. |
| 8,441,018 B2 | 5/2013 | Lee et al. |

(Continued)

FOREIGN PATENT DOCUMENTS

| KR | 10-2013-0092896 A | | 8/2013 | |
| KR | 20130092896 A | * | 8/2013 | ............... G09F 9/33 |
| WO | 2016005448 A1 | | 1/2016 | |

OTHER PUBLICATIONS

Machine Translation of KR 2013 0092896 (Year: 2012).*

(Continued)

*Primary Examiner* — J. E. Schoenholtz
(74) *Attorney, Agent, or Firm* — Sughrue Mion, PLLC

(57) ABSTRACT

Provided is a display apparatus. The display apparatus may include a monolithic device in which a light emitting element array, a transistor array, and a color control member are monolithically provided on one substrate. The display apparatus may include a first layered structure including the light emitting element array, a second layered structure including the transistor array, and a third layered structure including the color control member, wherein the second layered structure may be between the first layered structure and the third layered structure. The light emitting element array may include a plurality of light emitting elements comprising an inorganic material. The plurality of light emitting elements may have a vertical nanostructure.

44 Claims, 30 Drawing Sheets

(51) Int. Cl.

| | |
|---|---|
| *H01L 27/12* | (2006.01) |
| *H01L 33/44* | (2010.01) |
| *H01L 27/15* | (2006.01) |
| *H01L 33/50* | (2010.01) |
| *H04N 9/31* | (2006.01) |
| *H05B 33/28* | (2006.01) |
| *H01L 33/18* | (2010.01) |
| *H01L 33/24* | (2010.01) |

(52) U.S. Cl.
CPC ............ *H01L 27/15* (2013.01); *H01L 27/156* (2013.01); *H01L 33/32* (2013.01); *H01L 33/44* (2013.01); *H01L 33/504* (2013.01); *H04N 9/315* (2013.01); *H05B 33/28* (2013.01); *H01L 33/18* (2013.01); *H01L 33/24* (2013.01)

(56) References Cited

U.S. PATENT DOCUMENTS

| | | | |
|---|---|---|---|
| 9,831,387 | B2 | 11/2017 | Chu et al. |
| 9,854,632 | B2 | 12/2017 | Mercier et al. |
| 10,008,645 | B2* | 6/2018 | Bonar ................... H01L 27/156 |
| 2003/0138983 | A1* | 7/2003 | Biwa ....................... B82Y 20/00 |
| | | | 438/46 |
| 2010/0213467 | A1 | 8/2010 | Lee et al. |
| 2011/0291071 | A1 | 12/2011 | Kim et al. |
| 2014/0291666 | A1 | 10/2014 | Tsang |
| 2014/0291688 | A1 | 10/2014 | Tsang |
| 2016/0093665 | A1* | 3/2016 | Schubert ................ H01L 27/15 |
| | | | 257/13 |
| 2017/0025399 | A1 | 1/2017 | Takeya et al. |
| 2017/0125744 | A1 | 5/2017 | Kim et al. |
| 2017/0223784 | A1* | 8/2017 | Mercier ................ H01L 27/156 |
| 2018/0158808 | A1* | 6/2018 | Zhang ................. H01L 25/0753 |
| 2018/0351017 | A1* | 12/2018 | Schneider, Jr. ......... H01L 33/06 |

OTHER PUBLICATIONS

Definition of monolithic downloaded from URL< https://www.merriam-webster.com/dictionary/monolithic> on Aug. 1, 2019. (Year: 2019).*

Communication dated Oct. 23, 2018, from the European Patent Office in counterpart European Application No. 18176092.7.

* cited by examiner

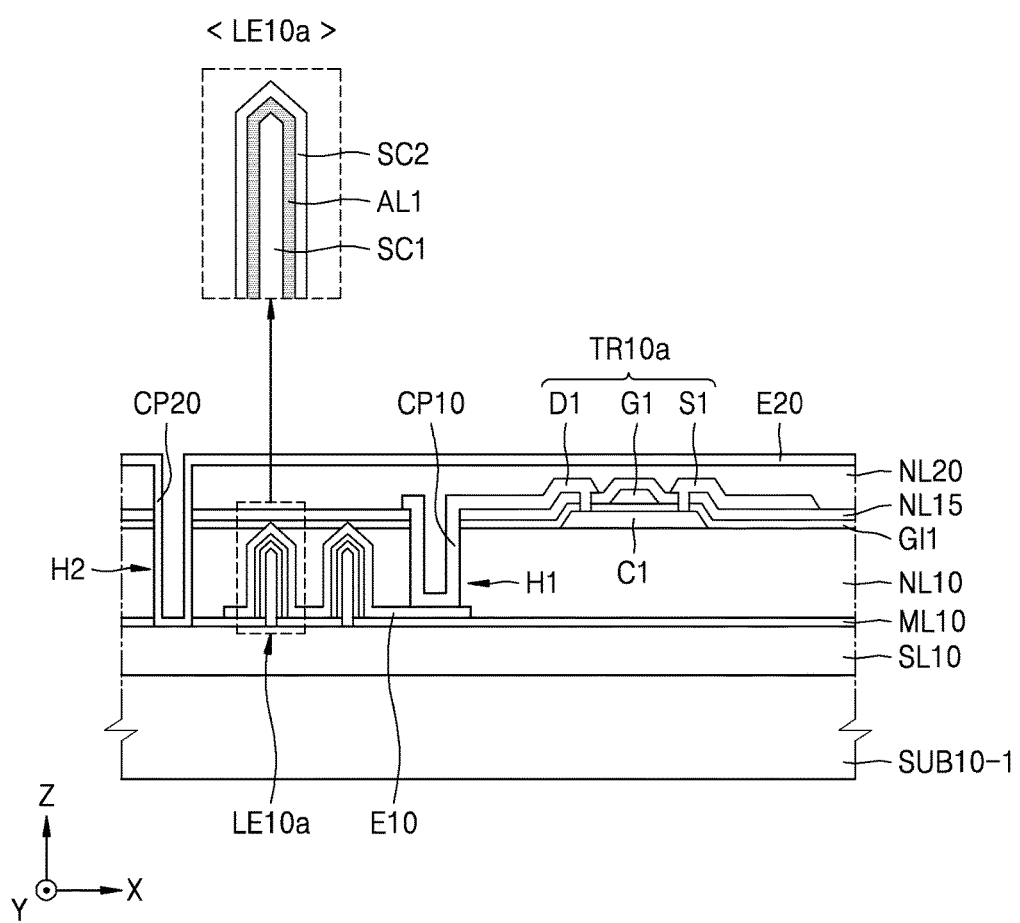

TRANSFER IN UNITS OF RGB PIXELS

PARTITION WALL

TFT array substrate

< COMPARATIVE EXAMPLE >

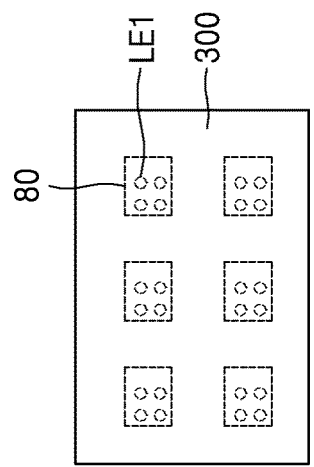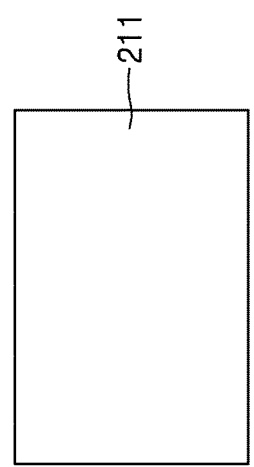
FIG. 22(A)     FIG. 22(B)     FIG. 23(A)     FIG. 23(B)
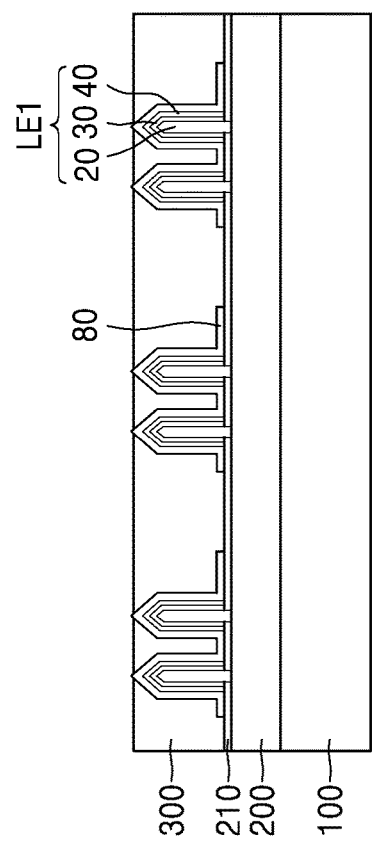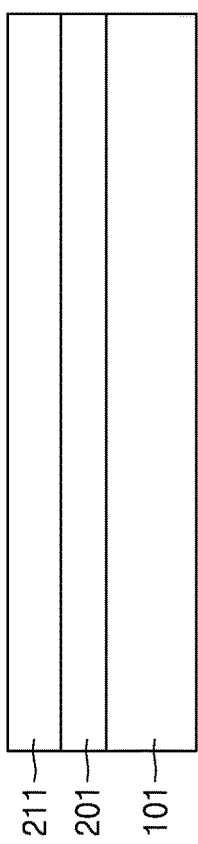

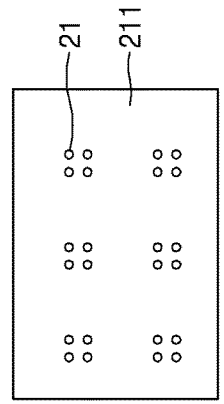
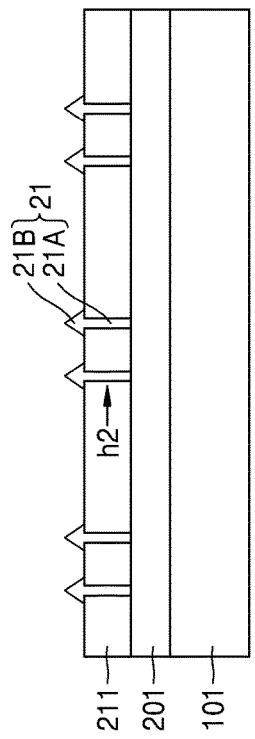
FIG. 24(A)  FIG. 24(B)
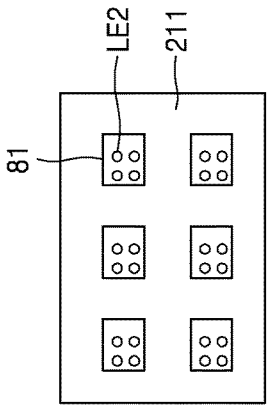
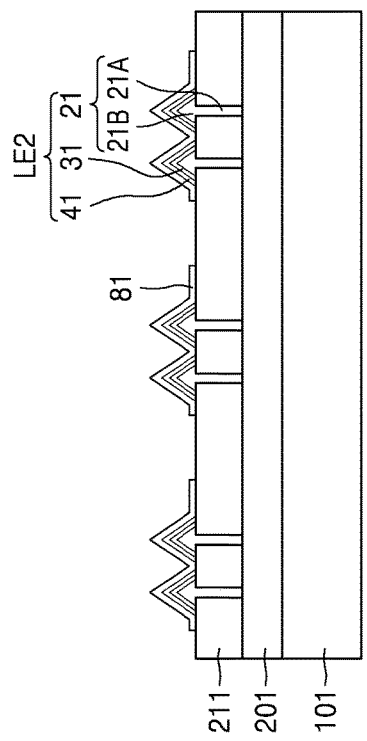
FIG. 25(A)  FIG. 25(B)

DISPLAY APPARATUS INCLUDING LAYERED STRUCTURES

CROSS-REFERENCE TO RELATED APPLICATIONS

This application claims the benefit of U.S. Provisional Application No. 62/515,161, filed on Jun. 5, 2017, in the US Patent Office and claims priority from Korean Patent Application Nos. 10-2017-0069526, filed on Jun. 5, 2017 and 10-2017-0091719, filed on Jul. 19, 2017, in the Korean Intellectual Property Office, the disclosures of which are incorporated herein in their entireties by reference.

BACKGROUND

1. Field

Apparatuses consistent with exemplary embodiments relate to display apparatuses.

2. Description of the Related Art

Liquid crystal displays (LCDs) and organic light emitting diode (OLED) displays are widely used as display apparatuses. However, an LCD such as a liquid crystal on silicon (LCOS) may be undesirably large, and an OLED has a short lifetime. In comparison with a LCOS display or an OLED display, an inorganic-based LED (iLED) display may have comparative advantages in various aspects such as brightness, resolution, contrast ratio, lifetime, multi-depth, form factor, and color purity.

SUMMARY

One or more exemplary embodiments pay provide display apparatuses suitable for high resolution implementation.

One or more exemplary embodiments pay provide a display apparatus that may be manufactured to have a small size and may have excellent characteristics in various aspects such as brightness, resolution, contrast ratio, lifetime, multi-depth, form factor, color purity, and power efficiency.

One or more exemplary embodiments pay provide light emitting elements (light emitting devices) that may be applied to the above display apparatuses.

Additional exemplary aspects and advantages will be set forth in part in the description which follows and, in part, will be apparent from the description, or may be learned by practice of the presented exemplary embodiments.

According to an aspect of an exemplary embodiment, a display apparatus includes: a substrate; a first layered structure provided on the substrate and including an array of a plurality of light emitting elements comprising an inorganic material; a second layered structure including an array of a plurality of transistors electrically connected to the plurality of light emitting elements; and a third layered structure including a color control member configured to adjust a color of light generated by the plurality of light emitting elements, wherein the second layered structure is disposed between the first layered structure and the third layered structure.

The plurality of light emitting elements may each include a vertical nanostructure perpendicular to the substrate, and the vertical nanostructure may have a core-shell structure including a first conductivity type semiconductor, an active layer, and a second conductivity type semiconductor.

A first electrode electrically contacting a first group of light emitting elements from among the plurality of light emitting elements may be provided on the substrate, a first insulating layer covering the first electrode and the first group of light emitting elements may be provided on the substrate, the plurality of transistors may be provided on the first insulating layer, a second insulating layer covering the plurality of transistors and the plurality of light emitting elements may be provided on the first insulating layer, a second electrode electrically connected to the plurality of light emitting elements may be provided on the second insulating layer, the first electrode may be connected to one of the plurality of transistors through a first conductive plug formed to penetrate the first insulating layer, and the second electrode may be connected to the plurality of light emitting elements through a second conductive plug formed to penetrate the first and second insulating layers.

A first electrode electrically contacting a first group of light emitting elements among the plurality of light emitting elements may be provided at a top surface of the substrate, a first insulating layer covering the first electrode and the first group of light emitting elements may be provided at a top surface of the substrate, the plurality of transistors may be provided on the first insulating layer, the first electrode may be connected to one of the plurality of transistors through a first conductive plug formed to penetrate the first insulating layer, and a second electrode electrically connected to the plurality of light emitting elements may be provided at a bottom surface of the substrate.

The second layered structure may include an insulating layer covering the plurality of light emitting elements and the plurality of transistors, the insulating layer may have a substantially flat surface, the third layered structure may be provided on a flat surface of the insulating layer, and the third layered structure may have a substantially flat layer structure.

The plurality of light emitting elements may be blue light emitting elements, the plurality of light emitting elements may include a first group of light emitting elements corresponding to a first subpixel, a second group of light emitting elements corresponding to a second subpixel, and a third group of light emitting elements corresponding to a third subpixel, and the color control member may include a blue-to-green color converting element corresponding to the second subpixel and a blue-to-red color converting element corresponding to the third subpixel. The color control member may further include a light scattering element corresponding to the first subpixel.

The display apparatus may further include: a yellow recycling film (YRF) provided between the second layered structure and the third layered structure; and a blue cut filter (BCF) provided on the third layered structure to cover the blue-to-green color converting element and the blue-to-red color converting element.

According to an aspect of another exemplary embodiment, a display apparatus includes: a light emitting element array provided on a substrate and including a plurality of light emitting elements based on an inorganic material; a transistor array including a plurality of transistors electrically connected to the plurality of light emitting elements; a color control member configured to adjust a color of light generated by the plurality of light emitting elements; a first optical film provided between the color control member and the light emitting element array to transmit a light of a first wavelength band and reflect a light of a second wavelength band; and a second optical film provided to face the first optical film with the color control member therebetween, to block a light of the first wavelength band and transmit a light of the second wavelength band, wherein the light emitting element array, the transistor array, the first optical film, the color control member, and the second optical film are monolithically provided on the substrate to construct a monolithic device.

The first optical film may include a yellow recycling film (YRF), and the second optical film may include a blue cut filter (BCF).

According to an aspect of another exemplary embodiment, an apparatus (an electronic apparatus) includes the above display apparatus. The apparatus may include a wearable apparatus or a portable apparatus. For example, the apparatus may include an augmented reality (AR) display, a virtual reality (VR) display, or a projection display.

According to an aspect of another exemplary embodiment, a light emitting device includes at least one vertical light emitting structure, the at least one vertical light emitting structure including: a first conductivity type semiconductor including a first portion perpendicular to a substrate and a second portion on the first portion, wherein the first portion has a first width and the second portion has a second width larger than the first width; an active layer covering the second portion of the first conductivity type semiconductor; and a second conductivity type semiconductor covering the active layer. The first portion may have a nanowire shape, and the second portion may have a nanopyramid shape. The first portion may have a width of about 600 nm or less and a height of about 1 μm or more. A surface of the second portion may include a (10-11) s-plane.

According to an aspect of another exemplary embodiment, a method of manufacturing a display apparatus includes: forming a first layered structure including an array of a plurality of light emitting elements on a substrate; forming a second layered structure including an array of a plurality of transistors electrically connected to the plurality of light emitting elements on the first layered structure; and forming a third layered structure including a color control member configured to adjust a color of light generated by the plurality of light emitting elements on the second layered structure, wherein the second layered structure is disposed between the first layered structure and the third layered structure.

BRIEF DESCRIPTION OF THE DRAWINGS

These and/or other exemplary aspects and advantages will become apparent and more readily appreciated from the following description of exemplary embodiments, taken in conjunction with the accompanying drawings in which:

FIG. 3A is a cross-sectional view illustrating a unit region of a display apparatus, according to an exemplary embodiment;

FIGS. 18(A) and 18(B) through 22(A) and 22(B) are diagrams illustrating a method of forming a plurality of light emitting elements in a method of manufacturing a display apparatus, according to an exemplary embodiment;

FIGS. 23(A) and 23(B) through to 26(A) and 26(B) are diagrams illustrating a method of forming a plurality of light emitting elements in a method of manufacturing a display apparatus, according to another exemplary embodiment;

DETAILED DESCRIPTION

Figure 1:
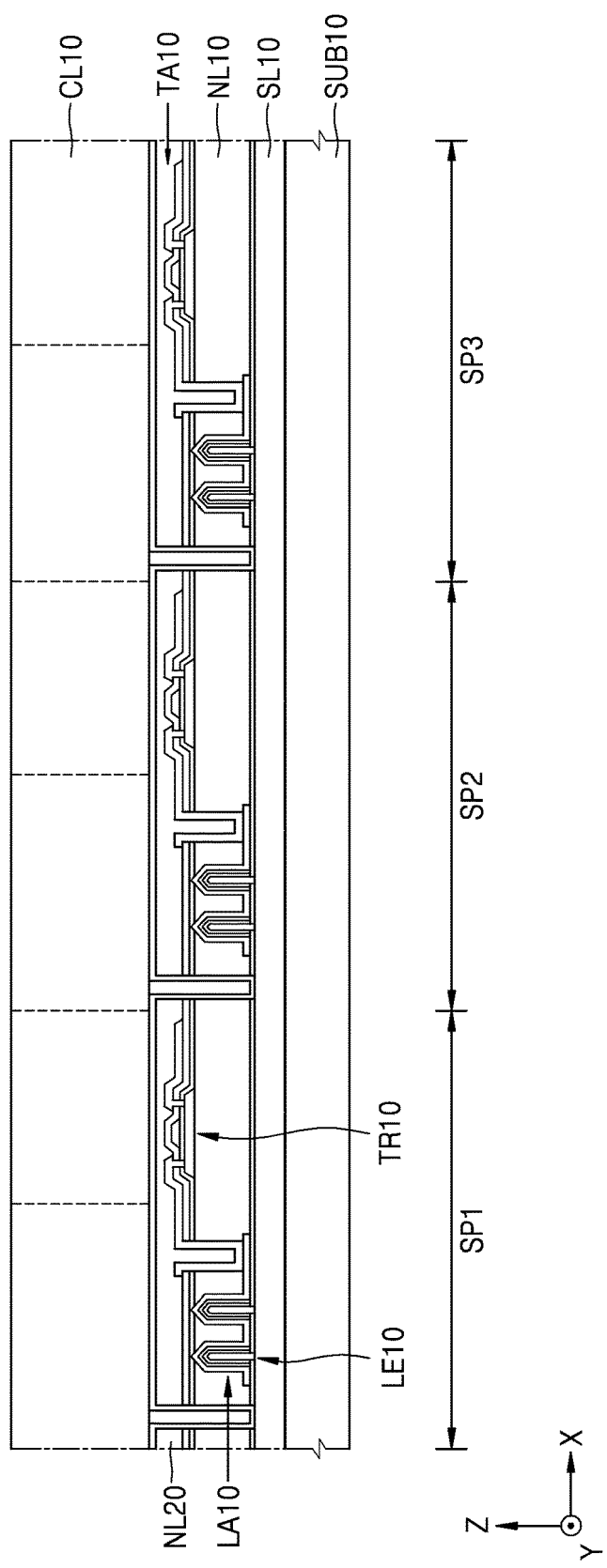
FIG. 1 is a cross-sectional view illustrating a display apparatus according to an exemplary embodiment.

Various exemplary embodiments will now be described more fully with reference to the accompanying drawings in which exemplary embodiments are shown.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized versions (and intermediate structures) of exemplary embodiments. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, display apparatuses according to exemplary embodiments will be described in detail with reference to the accompanying drawings. The widths and thicknesses of layers or regions illustrated in the accompanying drawings may be exaggerated for clarity and convenience of description. Like reference numerals may denote like elements throughout the specification.

Figure 2:
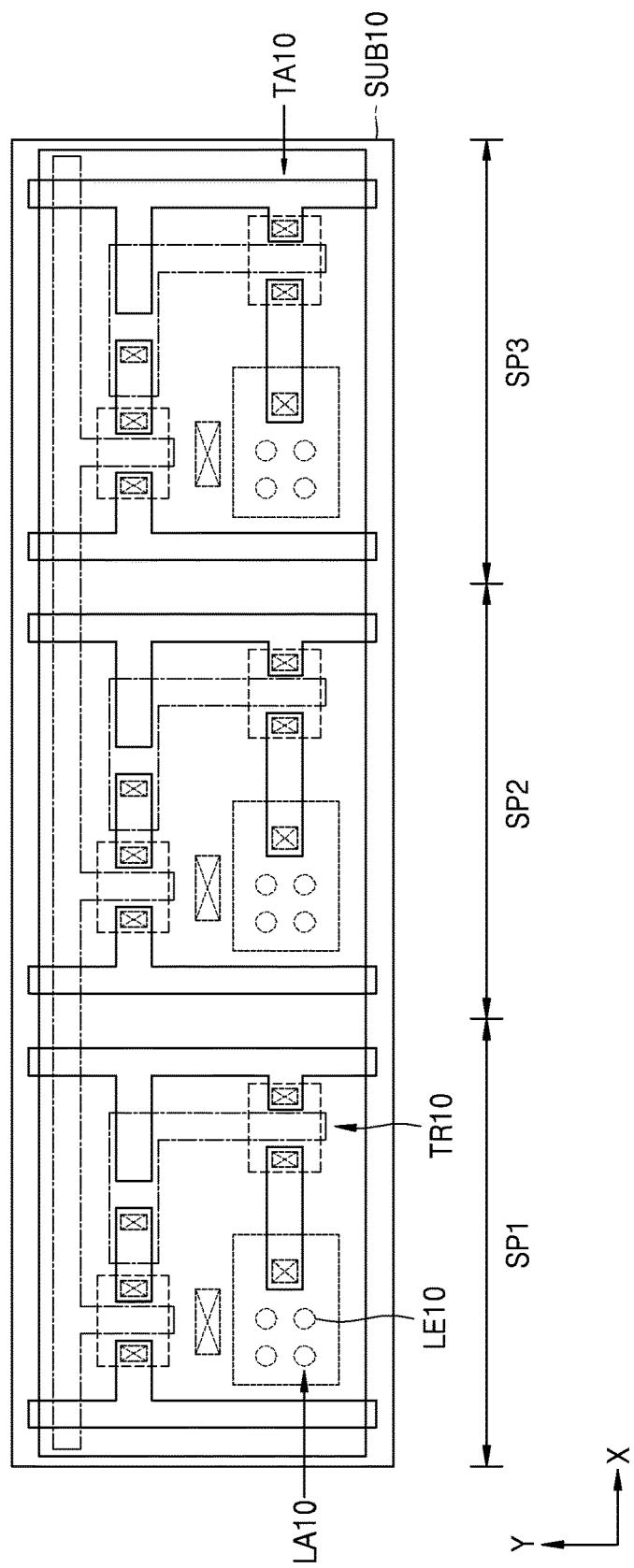
FIG. 2 is a plan view illustrating a display apparatus according to an exemplary embodiment.

FIGS. 1 and 2 are a cross-sectional view and a plan view illustrating a display apparatus according to an exemplary embodiment.

Referring to FIGS. 1 and 2, a light emitting element array LA10, including a plurality of light emitting elements LE10 and a transistor array TA10, including a plurality of transistors TR10 electrically connected to the plurality of light emitting elements LE10, may be provided on a substrate SUB10. Also, a color control member CL10 configured to adjust a color of light generated by the plurality of light emitting elements LE10 may be further provided. The color control member CL10 may have a generally flat layer structure (a substantially flat layer structure). The light emitting element array LA10, the transistor array TA10, and the color control member CL10 may be monolithically provided on one substrate SUB10. In other words, the light emitting element array LA10, the transistor array TA10, and the color control member CL10 may be monolithically formed on one substrate SUB10 without having been transferred from another substrate to the substrate SUB10.

With respect to the substrate SUB10, the transistor array TA10 may be disposed at a higher position than the light emitting element array LA10. In other words, the light emitting element array LA10 may be disposed closer to the substrate SUB10 than the transistor array TA10, and the transistor array TA10 may be disposed closer to the color control member CL10 than the light emitting element array LA10. The display apparatus may include a first layered structure including the light emitting element array LA10 and a second layered structure including the transistor array TA10, and the second layered structure may be disposed at a distance from the substrate SUB10 between that of the first layered structure and that of the color control member CL10.

As shown in FIGS. 1 and 2, each of the plurality of transistors TR10 may be disposed to be spaced apart from the light emitting element LE10 in a direction parallel to the substrate SUB10 such that the transistor TR10 does not overlap with the corresponding light emitting element LE10. Thus, the light generated by the light emitting element LE10 may be irradiated onto the color control member CL10 without being obstructed by, or having been incident on, the transistor TR10. However, when at least a portion of the transistor TR10 is transparent, the light emitting element LE10 may at least partially overlap the transistor TR10 corresponding thereto.

The plurality of light emitting elements LE10 may comprise an inorganic material-based light emitting device (LED). In other words, each of the plurality of light emitting elements LE10 may include an inorganic material-based light emitting material (semiconductor light emitting material). For example, the inorganic material-based light emitting material may include a III-V group-based semiconductor. The III-V group-based semiconductor may include a gallium nitride (GaN)-based semiconductor. However, the light emitting materials of the light emitting element LE10 are not limited thereto and may vary according to various embodiments.

The plurality of transistors TR10 may be thin film transistors (TFTs). Thus, the transistor array TA10 may be referred to as a TFT-based driving unit. A channel layer of the plurality of transistors TR10 may include polycrystalline silicon (poly-Si) or amorphous silicon (a-Si). Alternatively, the channel layer may include at least one of an oxide semiconductor, a nitride semiconductor, and an oxynitride semiconductor. For example, the channel layer may include at least one of a ZnO-based semiconductor, a SnO-based semiconductor, an InO-based semiconductor, ZnON-based semiconductor, a ZnONF-based semiconductor, a ZnN-based semiconductor, and a ZnNF-based semiconductor. In this case, the channel layer may further include an additional element X. The additional element X may include at least one of a group I element, a group II element, a group III element, a group IV element, a group V element, a transition metal element, and a lanthanum (Ln)-based element. As a particular example, the additional element X may include at least one of Li, K, Mg, Ca, Sr, Ba, Ga, Al, In, B, Si, Sn, Ge, Sb, Y, Ti, Zr, V, Nb, Ta, Sc, Hf, Mo, Mn, Fe, Co, Ni, Cu, W, La, Ce, Pr, Nd, Pm, Sm, Eu, Gd, Tb, Dy, Ho, Er, Tm, Yb, and Lu. Alternatively, the additional element X may include at least one of a group VI element and a group VII element. As a particular example, the additional element X may include at least one of F, Cl, Br, I, S, and Se. The ZnO-based semiconductor may include, for example, GaInZnO and HfInZnO. However, the above channel layer materials are merely examples and may vary according to various embodiments. For example, a III-V group-based semiconductor (e.g., GaN) or monocrystalline silicon may be used as a channel layer material. Also, an organic semiconductor may be used as a channel layer material.

The color control member CL10 may include a quantum dot (QD)-based color converter or a color filter. The color converter may change a color (wavelength) of light transmitted therethrough, and the color filter may selectively transmit light in a predetermined wavelength band. The color converter may include a mixture of a photoresist (PR) material, predetermined quantum dots, and a light scattering agent. The color filter may also include a quantum dot layer including a plurality of quantum dots. The quantum dots included in the color converter or in the color filter may have a core-shell structure having a core portion and a shell portion or may have a shell-less particle structure. The core-shell structure may be a single-shell structure or a multi-shell structure. The multi-shell structure may be, for example, a double-shell structure. Each of the quantum dots may include, for example, at least one of a II-VI group-based semiconductor, a III-V group-based semiconductor, a IV-VI group-based semiconductor, a IV group-based semiconductor, and a graphene quantum dot. Each of the quantum dots may have a diameter of about tens of nm or less, for example, a diameter of about 10 nm or less. An organic ligand or an inorganic ligand may exist at a surface of the quantum dot. The characteristics of the color converter or the color filter may vary according to the materials, configurations, and/or sizes of the quantum dots included in the color converter or the color filter. Herein, a description has been given of a case in which the color control member CL10 includes quantum dots; however, in some cases, the color control member CL10 may have another configuration that does not include quantum dots. Also, although not illustrated, an optical film or an optical filter may be provided on at least one of a top surface and a bottom surface of the color control member CL10.

The display apparatus of the present exemplary embodiment may include a plurality of unit regions SP1, SP2, and SP3. Three unit regions SP1, SP2, and SP3 are illustrated in FIG. 1. Each of the plurality of unit regions SP1, SP2, and SP3 may correspond to a subpixel region. Each of the plurality of unit regions SP1, SP2, and SP3 may include a group of light emitting elements LE10 and may include at least one transistor TR10 electrically connected to the group of light emitting elements LE10. The group of light emitting elements LE10 and the transistor TR10 connected thereto may be disposed to be spaced apart from each other in the direction parallel to the substrate SUB10 such that they do not overlap each other. The color control member CL10 may have different configurations in at least two of the plurality of unit regions SP1, SP2, and SP3. For this purpose, the color control member CL10 may include a plurality of different color control regions that are different from each other. The color control member CL10 may have a patterned layer structure.

In FIGS. 1 and 2, a combination of the light emitting array LA10 and the color control member CL10 may be referred to as an RGB light emitting unit. Also, the plurality of transistors TR10 may be referred to as constituting a transistor-based driving unit. The configurations of the plurality of light emitting elements LE10, the plurality of transistors TR10, and the color control member CL10, and the connection relationships therebetween will be described in more detail with reference to FIGS. 3A to 12.

Figure 3B:
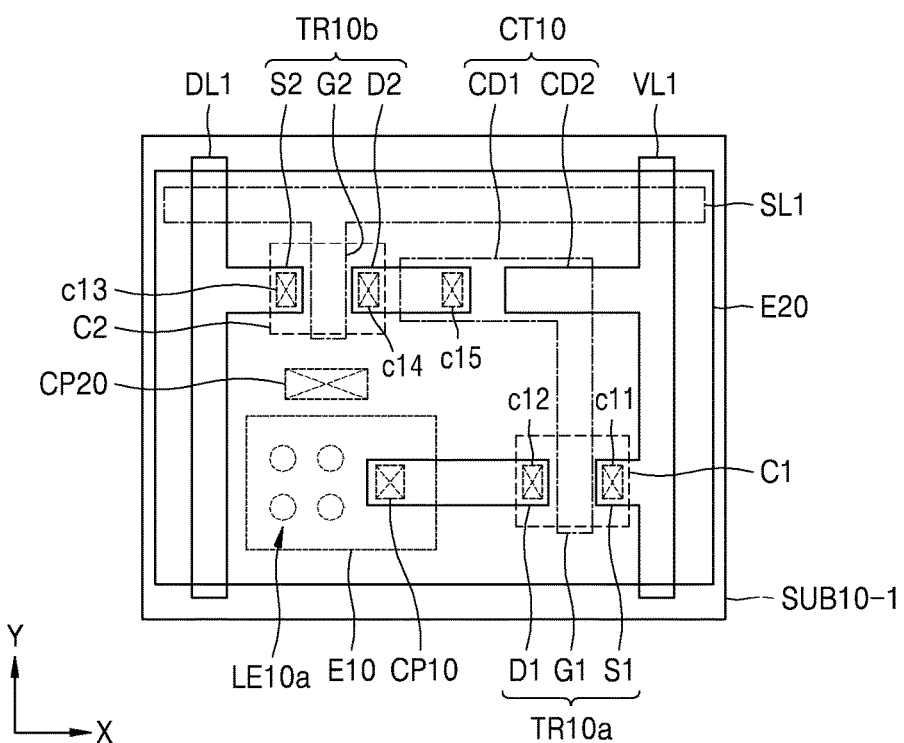
FIG. 3B is a plan view illustrating an example of a planar structure of a unit region of a display apparatus, according to the exemplary embodiment of FIG. 3A.

FIG. 3A is a cross-sectional view illustrating a unit region of a display apparatus according to an exemplary embodiment. FIG. 3B is an example of a plan view corresponding to FIG. 3A.

Referring to FIG. 3A, a semiconductor layer SL10 may be provided on a substrate SUB10-1. The substrate SUB10-1 may be any one of various substrates used in a general semiconductor device process. For example, the substrate SUB10-1 may include an insulator such as sapphire (Al2O3). However, the substrate SUB10-1 may include materials other than sapphire (Al2O3). The semiconductor layer SL10 may be, for example, an n-type semiconductor layer or may be a p-type semiconductor layer in some cases. The semiconductor layer SL10 may have a single-layer structure or a multi-layer structure. The semiconductor layer SL10 may include a III-V group-based n-type semiconductor, for example, n-GaN.

A mask layer ML10 having at least one opening may be provided on the semiconductor layer SL10. At least one light emitting element LE10a may be formed from a region of the semiconductor layer SL10 exposed by the opening of the mask layer ML10. A plurality of light emitting elements LE10a may be provided in one unit region, which may be referred to as a first light emitting element group. As illustrated in an enlarged view above, each of the light emitting elements LE10a may include a first conductivity type semiconductor SC1, a second conductivity type semiconductor SC2, and an active layer AL1 therebetween.

The plurality of light emitting elements LE10a may be a vertical light emitting structure perpendicular to the substrate SUB10-1. The vertical light emitting structure may have, for example, a nanowire shape. The vertical light emitting structure LE10a may include a first conductivity type semiconductor SC1 having a nanopillar shape, and an active layer AL1 and a second conductivity type semiconductor SC2 surrounding the first conductivity type semiconductor SC1. The first conductivity type semiconductor SC1 may be referred to as a core portion connected to the semiconductor layer SL10, and the active layer AL1 and the second conductivity type semiconductor SC2 may be referred to as a shell portion. Therefore, the vertical light emitting structure may be referred to as having a core-shell structure.

The first conductivity type semiconductor SC1 may be an n type and the second conductivity type semiconductor SC2 may be a p type, or vice versa. The active layer AL1 may include a light emitting layer that emits light when electrons and holes combine together. The first conductivity type semiconductor SC1, the active layer AL1, and the second conductivity type semiconductor SC2 may have various modified structures. For example, the first conductivity type semiconductor SC1 and the second conductivity type semiconductor SC2 may have a multi-layer structure. The active layer AL1 may have a structure in which a quantum well layer and a barrier layer are alternately stacked one or more times. In this case, the quantum well layer may have a single-quantum well (SQW) structure or a multi-quantum well (MQW) structure. At least one of the first conductivity type semiconductor SC1, the active layer AL1, and the second conductivity type semiconductor SC2 may have a III-V group-based semiconductor. As an example, the first conductivity type semiconductor SC1 may include an n-GaN-based material, the second conductivity type semiconductor SC2 may include a p-GaN-based material, and the active layer AL1 may have a GaN-based MQW structure. Also, although not illustrated, the light emitting element LE10a may further include a superlattice structure layer. Also, at least one of the active layer AL1 and the second conductivity type semiconductor SC2 may have a continuous layer structure to cover a region of the plurality of light emitting elements LE10a, instead of being patterned in units of each light emitting element LE10a. In this case, the plurality of light emitting elements LE10a may have a connected structure without being electrically isolated from each other.

A first electrode E10 contacting a first region of the plurality of light emitting elements LE10a may be provided on the mask layer ML10. The first electrode E10 may contact the second conductivity type semiconductor SC2 of the light emitting element LE10a. For example, the first electrode E10 may be a p-type electrode. Also, the first electrode E10 may be a kind of anode and may be formed of a transparent conductive material.

A first insulating layer NL10 covering the plurality of light emitting elements LE10a or filling a surrounding region thereof may be provided on the mask layer ML10. The first insulating layer NL10 may be formed of a transparent material and may mostly or at least partially cover the plurality of light emitting elements LE10a and the first electrode E10. The first insulating layer NL10 may have a height equal or similar to that of the light emitting element LE10a. A portion of the top of the light emitting element LE10a may somewhat protrude above the first insulating layer NL10. However, this is merely an example, and it may not protrude in some cases.

A first transistor TR10a may be provided on the first insulating layer NL10. The first transistor TR10a may include a first channel layer C1, a first source electrode S1, a first drain electrode D1, a first gate electrode G1, and a gate insulating layer GI1. The first channel layer C1 may be provided on the first insulating layer NL10, and the gate insulating layer GI1 may be provided to cover the first channel layer C1. The first gate electrode G1 corresponding to the first channel layer C1 may be provided on the gate insulating layer GI1. The first source electrode S1 and the first drain electrode D1, electrically connected to the first channel layer C1, may be provided on both sides of the gate electrode G1. An intermediate insulating layer (interlayer insulating layer) NL15, covering the first gate electrode G1, may be provided on the gate insulating layer GI1, and the first source electrode S1 and the first drain electrode D1, electrically connected to the first channel layer C1, may be provided on the intermediate insulating layer NL15.

The first transistor TR10a may be electrically connected to the plurality of light emitting elements LE10a. The first transistor RR10a may be connected to the first electrode E10 through a first conductive plug CP10 provided in the first insulating layer NL10. The first conductive plug CP10 may penetrate the intermediate insulating layer NL15, the gate insulating layer GI1, and the first insulating layer NL10. In other words, a first hole H1 may penetrate the intermediate insulating layer NL15, the gate insulating layer GI1, and the first insulating layer NL10, thereby exposing the first electrode E10, and the first conductive plug CP10 may be provided in the first hole H1. The first conductive plug CP10 may at least partially fill the first hole H1. The first conductive plug CP10 may mostly or completely fill the first hole H1.

A transparent second insulating layer NL20, covering the first transistor TR10a and the plurality of light emitting elements LE10a, may be provided on the substrate SUB10-1. A top surface of the second insulating layer NL20 may be flat or substantially flat. For example, the top surface of the second insulating layer NL20 may be planarized by a chemical mechanical polishing (CMP) process. A second electrode E20, electrically connected to a second region of the plurality of light emitting elements LE10a, may be provided on the second insulating layer NL20. The second electrode E20 may be electrically connected to the first conductivity type semiconductor SC1 of the plurality of light emitting elements LE10a. For example, the second electrode E20 may be an n-type electrode. Also, the second electrode E20 may be referred to as a common cathode. The second electrode E20 may be formed of a transparent conductive material and may be grounded or connected to a ground electrode.

The second electrode E20 may be connected to the plurality of light emitting elements LE10a through a second conductive plug CP20, which penetrates the first and second insulating layers NL10 and NL20. A second hole H2 may penetrate the second insulating layer NL20, the intermediate insulating layer NL15, the gate insulating layer GI1, the first insulating layer NL10, and the mask layer ML10, thereby exposing the semiconductor layer SL10, and the second conductive plug CP20 may be provided in the second hole H2. The second conductive plug CP20 may partially or completely fill the second hole H2. The second conductive plug CP20 may be electrically connected to the first conductivity type semiconductor SC1 of the plurality of light emitting elements LE10a through the semiconductor layer SL10.

FIG. 3B is a plan view illustrating an example of a planar structure of a unit region of a display apparatus according to the exemplary embodiment of FIG. 3A.

Referring to FIG. 3B, a scan line SL1 extending in a predetermined direction, for example, an X-axis direction may be provided on the substrate SUB10-1. A data line DL1 and a voltage source line VL1 may be provided to extend in a direction intersecting the scan line SL1, for example, a Y-axis direction. The data line DL1 and the voltage source line VL1 may be spaced apart from each other in the X-axis direction. A first group of light emitting elements LE10a may be provided between the data line DL1 and the voltage source line VL1.

A first transistor TR10a, connected between the voltage source line VL1 and the plurality of light emitting elements LE10a, may be provided. A second transistor TR10b may be provided near or at an intersection between the scan line SL1 and the data line DL1. Also, a capacitor CT10 connected between the voltage source line VL1 and the first and second transistors TR10a and TR10b may be further provided.

The first transistor TR10a may include a first channel layer C1, a first gate electrode G1, a first source electrode S1, and a first drain electrode D1. Herein, the first source electrode S1 may be a portion protruding from the voltage source line VL1 in a direction perpendicular thereto. The first drain electrode D1 may be spaced apart from the first source electrode S1, and the first gate electrode G1 may be disposed therebetween. The first transistor TR10a may be a driving transistor.

The second transistor TR10b may include a second channel layer C2, a second gate electrode G2, a second source electrode S2, and a second drain electrode D2. The second gate electrode G2 may be a portion protruding from the scan line SL1 in a direction perpendicular thereto. The second source electrode S2 may be a portion protruding from the data line DL1 in a direction perpendicular thereto. The second drain electrode D2 may be spaced apart from the second source electrode S2, and the second gate electrode G2 may be disposed therebetween. The second transistor TR10b may be a switching transistor.

The capacitor CT10 may include a first conductor CD1 and a second conductor CD2, and an insulating layer (a dielectric layer) may be provided therebetween. The first conductor CD1 may be a layer provided on the same level as that of the first and second gate electrodes G1 and G2, and may be electrically connected to the second drain electrode D2. Also, the first conductor CD1 may be connected to the first gate electrode G1. The first conductor CD1 and the first gate electrode G1 may form a bent structure (e.g., an L-shaped structure). The second conductor CD2 may be a portion protruding from the voltage source line VL1 in a direction perpendicular thereto, and may extend above the first conductor CD1.

The first and second channel layers C1 and C2 may include polycrystalline silicon (poly-Si) or amorphous silicon (a-Si), or may include at least one of an oxide semiconductor, a nitride semiconductor, and an oxynitride semiconductor. However, the above-described channel layer materials are merely examples and other channel layer materials may be used. For example, the first and second channel layers C1 and C2 may include a III-V group-based semiconductor (e.g., GaN), monocrystalline silicon, or an organic semiconductor.

The first electrode E10 may be connected to the first drain electrode D1 through the first conductive plug CP10. The second electrode E20 may be connected to the semiconductor layer SL10 (see FIG. 3A) through the second conductive plug CP20. The first electrode E10 may be referred to as being electrically connected to a first region of the plurality of light emitting elements LE10a, and the second electrode E20 may be referred to as being electrically connected to a second region of the plurality of light emitting elements LE10a. Meanwhile, reference numerals c11 and c12 denote contact portions connecting the first channel layer C1 to the first source electrode S1 and the first drain electrode D1, reference numerals c13 and c14 denote contact portions connecting the second channel layer C2 to the second source electrode S2 and the second drain electrode D2, and a reference numeral c15 denotes a contact portion connecting the first conductor CD1 to the second drain electrode D2.

The first transistor TR10a may be an n-type transistor (e.g., an NMOS transistor) or a p-type transistor (e.g., a PMOS transistor), and the functions of the first source electrode S1 and the first drain electrode D1 may be reversed according to the types thereof. Likewise, the second transistor TR10b may be an n-type transistor or a p-type transistor, and the functions of the second source electrode S2 and the second drain electrode D2 may be reversed according to the types thereof.

Figure 4A:
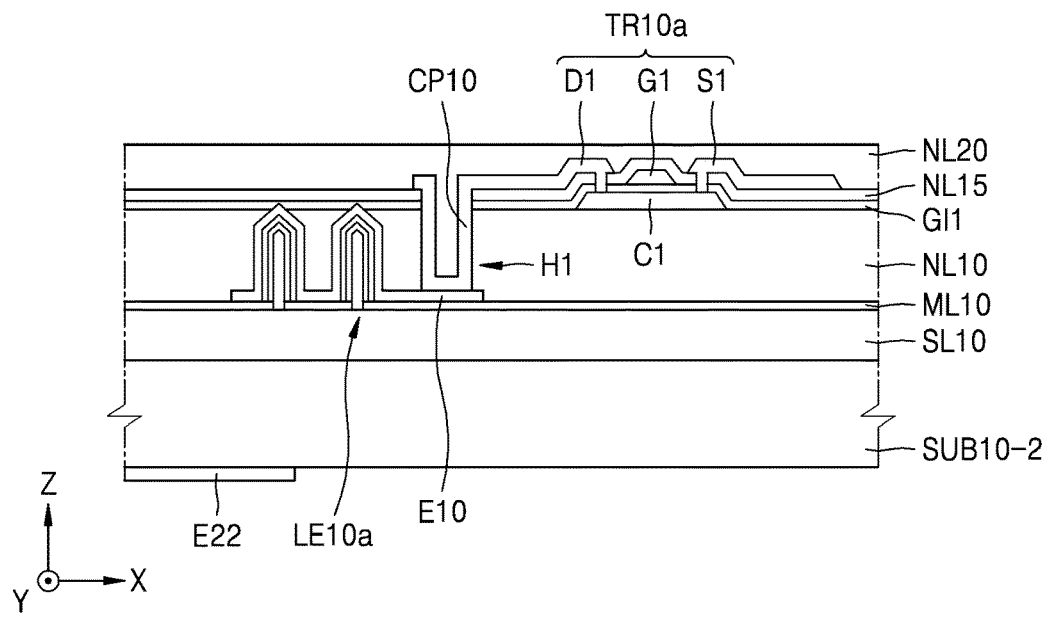
FIG. 4A is a cross-sectional view illustrating a unit region of a display apparatus, according to another exemplary embodiment.
Figure 4B:
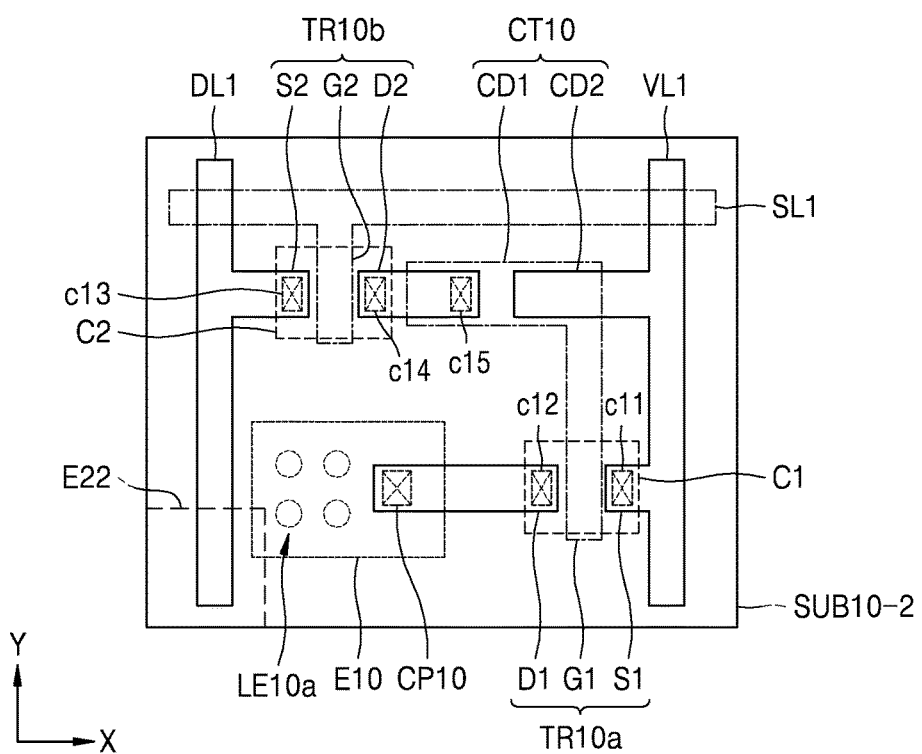
FIG. 4B is a plan view illustrating an example of a planar structure of a unit region of a display apparatus, according to the exemplary embodiment of FIG. 4A.

FIG. 4A is a cross-sectional view illustrating a unit region of a display apparatus according to another exemplary embodiment. FIG. 4B is an example of a plan view corresponding to FIG. 4A.

Referring to FIGS. 4A and 4B, in the present exemplary embodiment, a second electrode E22 may be provided at a bottom surface (rear or back surface) of a substrate SUB10-2. Herein, the substrate SUB10-2 may be a semiconductor substrate or a conductive substrate. In this case, even when the second electrode E22 is provided at the bottom surface of the substrate SUB10-2, the second electrode E22 may be electrically connected to a plurality of light emitting elements LE10a through the substrate SUB10-2 and a semiconductor layer SL10. The second electrode E22 may be a transparent electrode or an opaque electrode.

The substrate SUB10-2 of the present embodiment may be, for example, a Si substrate. The Si substrate may be a Si (111) substrate, and may be doped with predetermined conductive impurities when appropriate. However, the types/materials of the substrate SUB10-2 are not limited thereto and may vary according to various embodiments. Various substrates such as a sapphire ($Al_2O_3$) substrate, a Si substrate, a SiC substrate, an amorphous AN substrate, and a Si—Al substrate may be used as the substrate SUB10-1 of FIG. 3A or the substrate SUB10-2 of FIG. 4A. As illustrated in FIGS. 4A and 4B, when the second electrode E22 is provided at the bottom surface of the substrate SUB10-2, its size may be reduced. Also, since the second conductive plug CP20 (see FIGS. 3A and 3B) need not be formed, a process thereof may be simplified. In some cases, instead of separately forming the second electrode E22, the substrate SUB10-2 itself may be used as an electrode (second electrode).

In FIGS. 4A and 4B, other than the size and/or position of the second electrode E22 and the fact that the second conductive plug CP20 (see FIGS. 3A and 3B) is not included, the other configurations may be identical or similar to those described with reference to FIGS. 3A and 3B.

In FIGS. 3B and 4B, an area of a region occupied by a group of light emitting elements LE10a in one unit region is illustrated as being comparatively smaller than an area of a region occupied by two transistors TR10a and TR10b and one capacitor CT10; however, the comparative ratio of the areas of the regions may vary in an actual device. In one unit region (subpixel), an area of the first electrode E10 contacting a group of light emitting elements LE10a may be about 40% or more or about 50% or more of an area of the unit region. In an actual device, the transistors TR10a and TR10b and the capacitor CT10 may be formed in sizes smaller than those illustrated in FIGS. 3B and 4B. About four or more light emitting elements LE10a may be included in one unit region.

Although FIGS. 3A and 4A illustrate cases in which the first electrode E10 completely covers the plurality of light emitting elements LE10a, a portion of the plurality of light emitting elements LE10a, for example, an end portion of the top thereof may not be covered by the first electrode E10. An example thereof is illustrated in FIG. 5.

Figure 5:
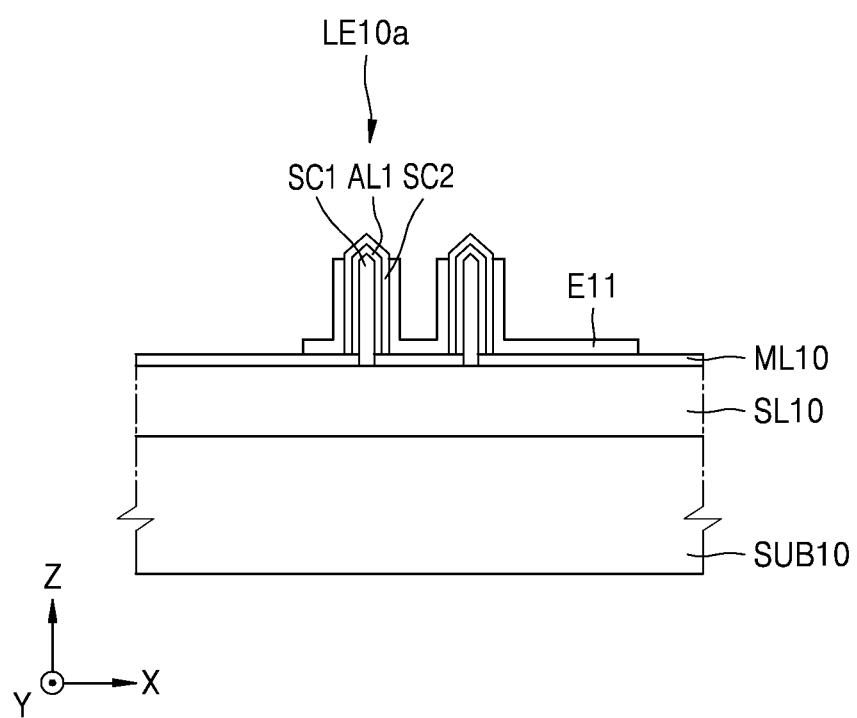
FIG. 5 is a cross-sectional view illustrating a light emitting element and an electrode structure that may be applied to a display apparatus, according to an exemplary embodiment.

Referring to FIG. 5, an end portion of the top of a plurality of light emitting elements LE10a may not be covered by a first electrode E11. The first electrode E11 may be obtained by forming an electrode material layer completely covering the plurality of light emitting elements LE10a and then removing a portion thereof. When a top region of the plurality of light emitting elements LE10a is not covered by the first electrode E11, the emission efficiency of light emitted upward from the plurality of light emitting elements LE10a may be improved. Except for the shape of the first electrode E11, the other configurations may be the same as those described with reference to FIG. 3A or 4A.

FIGS. 3B and 4B illustrate an example of a case in which a unit region of the display apparatus has a 2T (transistor)-1C (capacitor) configuration. In this case, a circuit configuration of the unit region of the display apparatus according to an exemplary embodiment may be the same as that illustrated in FIG. 6.

Figure 6:
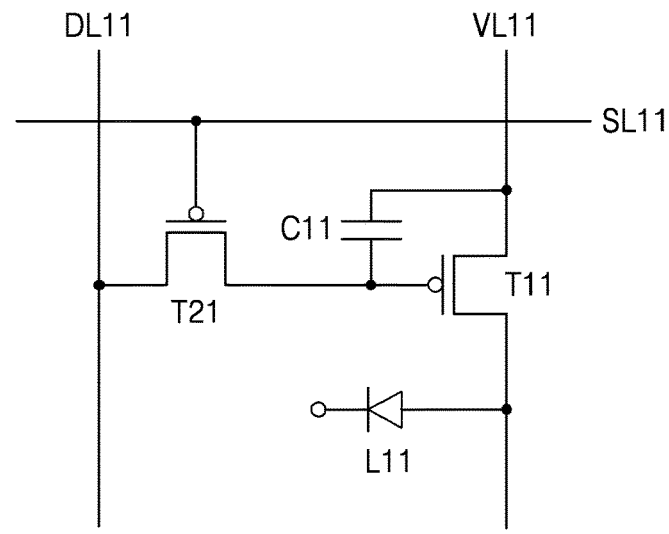
FIG. 6 is a circuit diagram illustrating a circuit configuration of a unit region of a display apparatus, according to an exemplary embodiment.

FIG. 6 is a circuit diagram illustrating a circuit configuration of a unit region of a display apparatus according to an exemplary embodiment.

Referring to FIG. 6, a scan line SL11 may be provided, and a data line DL11 and a voltage source line VL11 intersecting the scan line SL11 may be provided. A first transistor T11, connected between the voltage source line VL11 and a first group of light emitting elements L11, may be provided. A second transistor T21 may be provided at an intersection between the scan line SL11 and the data line DL11. A capacitor C11 connected between the voltage source line VL11 and the first and second transistors T11 and T21 may be provided. The scan line SL11, the data line DL11, the voltage source line VL11, the light emitting element L11, the first transistor T11, the second transistor T21, and the capacitor C11 may respectively correspond to the scan line SL1, the data line DL1, the voltage source line VL1, the light emitting element LE10a, the first transistor TR10a, the second transistor TR10b, and the capacitor CT10 of FIG. 3B.

According to other exemplary embodiments, a unit region of the display apparatus may have a configuration in which three or more transistors and one or more capacitors are combined. For example, as illustrated in FIG. 7, a unit region of the display apparatus may have a 4T-2C configuration.

Figure 7:
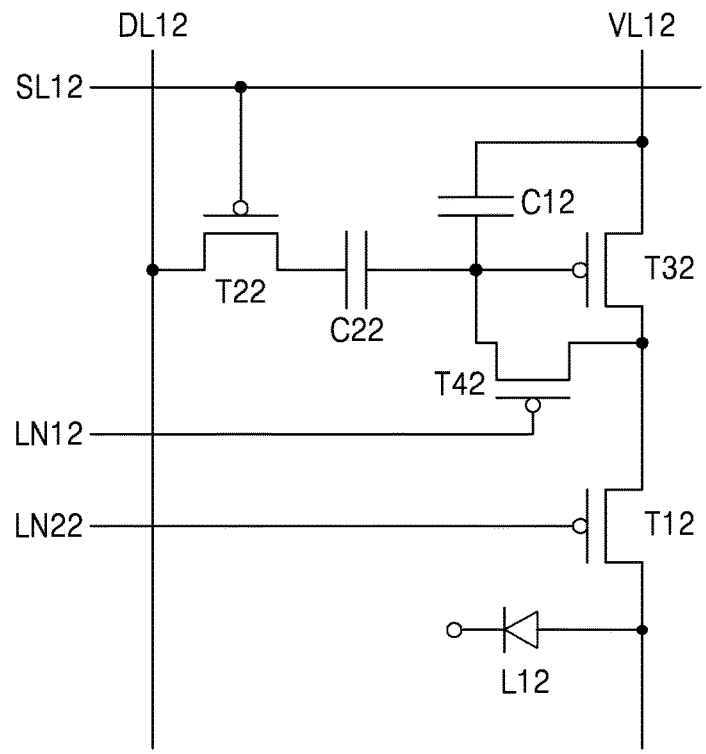
FIG. 7 is a circuit diagram illustrating a circuit configuration of a unit region of a display apparatus, according to another exemplary embodiment.

FIG. 7 is a circuit diagram illustrating a circuit configuration of a unit region of a display apparatus according to another exemplary embodiment.

Referring to FIG. 7, a scan line SL12 may be provided, and a data line DL12 and a voltage source line VL12 intersecting the scan line SL12 may be provided. A first transistor T12 connected between the voltage source line VL12 and a first group of light emitting elements L12 may be provided. A second transistor T22 may be provided at an intersection between the scan line SL12 and the data line DL12. A third transistor T32, connected between the second transistor T22 and the voltage source line VL12, may be provided. A first capacitor C12, connected between the voltage source line VL12 and the third transistor T32, may be provided. A fourth transistor T42, connected between the first capacitor C12 and the third transistor T32, may be provided. A second capacitor C22, connected between the second transistor T22 and the third transistor T32, may be provided. A first additional line LN12, connected to a gate of the fourth transistor T42, may be further provided, and a second additional line LN22, connected to a gate of the first transistor T12, may be further provided.

The circuit configurations of the unit regions described with reference to FIGS. 6 and 7 are merely examples and may be modified in any of various ways. In some cases, a unit region of the display apparatus may include four or more transistors and/or two or more capacitors.

Figure 8:
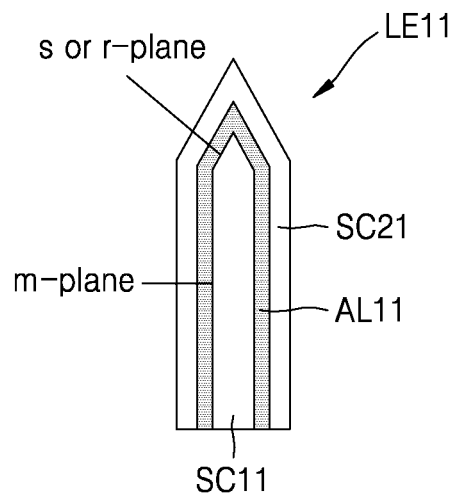
FIG. 8 is a cross-sectional view illustrating a light emitting element that may be applied to a display apparatus, according to an exemplary embodiment.

FIG. 8 is a cross-sectional view illustrating a light emitting element that may be applied to a display apparatus according to an exemplary embodiment.

Referring to FIG. 8, a light emitting element LE11 may be a vertical light emitting structure, and the vertical light emitting structure may have a core-shell structure and a nanowire shape. The vertical light emitting structure LE11 may include a first conductivity type semiconductor SC11 having a nanopillar shape, and an active layer AL11 and a second conductivity type semiconductor SC21 surrounding the first conductivity type semiconductor SC11. The first conductivity type semiconductor SC11 may be referred to as a core portion, and the active layer AL11 and the second conductivity type semiconductor SC21 may be referred to as a shell portion. The materials and/or configurations of the first conductivity type semiconductor SC11, the active layer AL11, and the second conductivity type semiconductor SC21 may be identical or similar to those described with reference to FIG. 3A. As an example, the first conductivity type semiconductor SC11 may include an n-GaN-based material, the second conductivity type semiconductor SC21 may include a p-GaN-based material, and the active layer AL11 may have a GaN-based MQW structure.

A side plane (vertical plane) of the first conductivity type semiconductor SC11 may be a (10-10) m-plane. An inclined plane of the top of the first conductivity type semiconductor SC11 may be a (10-11) s-plane or a (10-12) r-plane. For improvement of light emission characteristics, it may be advantageous to form the active layer AL11 having an MQW structure at a surface of the first conductivity type semiconductor SC11 having such crystal planes. In an MQW structure formed by crystal planes other than a (10-10) m-plane, a (10-11) s-plane, a (10-12) r-plane, and a (0001) c-plane, an indium composition may change and thus a half width of a peak spectrum may increase and the color purity thereof may decrease. When the light emitting element LE11 of the present exemplary embodiment is used, such problems may be suppressed or prevented. The light emitting element LE11 of the present exemplary embodiment may be referred to as having a non-polar core-shell structure.

Figure 9:
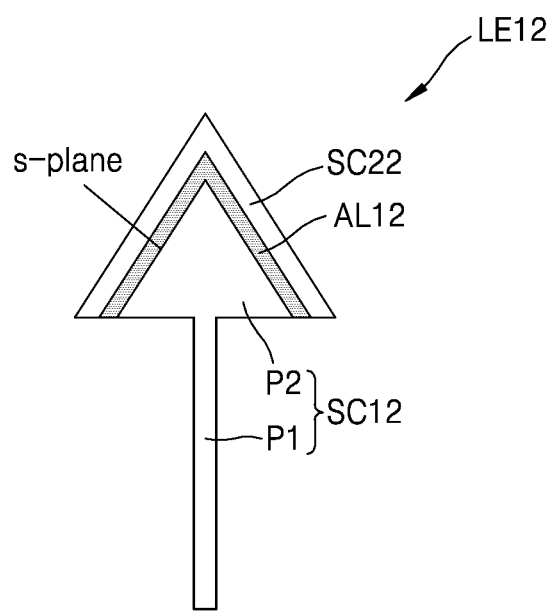
FIG. 9 is a cross-sectional view illustrating a light emitting element that may be applied to a display apparatus, according to another exemplary embodiment.

FIG. 9 is a cross-sectional view illustrating a light emitting element that may be applied to a display apparatus according to another exemplary embodiment.

Referring to FIG. 9, a light emitting element LE12 may be a vertical light emitting structure, and the vertical light emitting structure may have a core-shell structure. The vertical light emitting structure may have the shape of a combination of a nanowire and a nanopyramid. For example, a first conductivity type semiconductor SC12 may include a first portion P1 perpendicular to a substrate and a second portion P2 provided on the first portion P1. Herein, the first portion P1 may have a first width, and the second portion P2 may have a second width larger than the first width. The first portion P1 may have a nanowire shape, and the second portion P2 may have a nanopyramid shape or a similar shape. The first portion P1 may have a width of about 600 nm or less, for example, a width of about 100 nm to about 500 nm and may have a height (length) of about 1 μm or more. A surface (inclined plane) of the second portion P2 may be a (10-11) s-plane.

The light emitting element LE12 may include an active layer AL12 covering the second portion P2 of the first conductivity type semiconductor SC12 and a second conductivity type semiconductor SC22 covering the active layer AL12. The second portion P2 of the first conductivity type semiconductor SC12 may be a core portion, and the active layer AL12 and the second conductivity type semiconductor SC22 may be a shell portion. At least one of the first conductivity type semiconductor SC12, the active layer AL12, and the second conductivity type semiconductor SC22 may have a III-V group-based semiconductor. As an example, the first conductivity type semiconductor SC12 may include an n-GaN-based material, the second conductivity type semiconductor SC22 may include a p-GaN-based material, and the active layer AL12 may have a GaN-based MQW structure.

As in the present exemplary embodiment, when a nanowire portion having a small width is formed (grown) and a nanopyramid portion is formed (grown) thereon, the nanopyramid portion may have crystallographically excellent characteristics. As a narrow first portion P1 grows, various defects such as dislocation may be removed or suppressed and consequently the second portion P2 may have excellent crystalline characteristics and few or no defects. Thus, the second conductivity type semiconductor SC22 and the active layer AL12 formed on the second portion P2 may also have excellent crystalline characteristics. In addition, when the second portion P2 has a (10-11) s-plane at its surface, it may be more advantageous for improvement of the light emission characteristics. The light emitting element LE12 of the present exemplary embodiment may be referred to as having a semi-polar core-shell structure.

When the light emitting elements LE11 and LE12, as shown in FIGS. 8 and 9, having a vertical nanostructure are used, it may be advantageous for implementation of high-integration devices and for implementation of high resolution.

Figure 10:
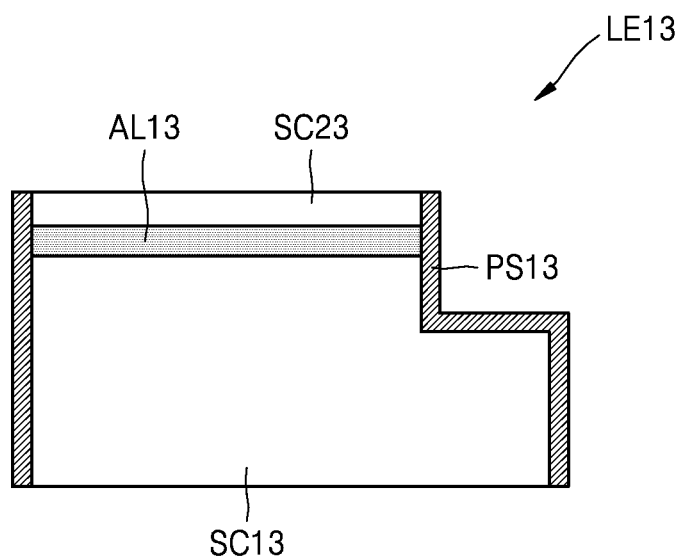
FIG. 10 is a cross-sectional view illustrating a light emitting element that may be applied to a display apparatus, according to another exemplary embodiment.

FIG. 10 is a cross-sectional view illustrating a light emitting element that may be applied to a display apparatus according to another exemplary embodiment.

Referring to FIG. 10, a light emitting element LE13 may include a mesa-type light emitting structure. The mesa-type light emitting structure may include a first conductivity type semiconductor SC13, an active layer AL13, and a second conductivity type semiconductor SC23. The first conductivity type semiconductor SC13, the active layer AL13, and the second conductivity type semiconductor SC23 may form a layered structure substantially parallel to a substrate. At least a portion of the first conductivity type semiconductor SC13 may have a width larger than that of the active layer AL13 and of the second conductivity type semiconductor SC23, and may have a shape that protrudes sideways. Thus, a top surface of a protruding portion of the first conductivity type semiconductor SC13 may not be covered by the active layer AL13 and the second conductivity type semiconductor SC23. The materials of the first conductivity type semiconductor SC13, the active layer AL13, and the second conductivity type semiconductor SC23 may be identical or similar to the materials of the first conductivity type semiconductor SC1, the active layer AL1, and the second conductivity type semiconductor SC2 described with reference to FIG. 3A.

The light emitting element LE13 may further include a passivation layer PS13 covering a side surface of the mesa-type light emitting structure. The passivation layer PS13 may be formed of an insulator or a semiconductor such as p-GaN, $SiO_2$, $Si_3N_4$, or $Al_2O_3$. Since the mesa-type light emitting structure is formed by etching, when a side surface (etching surface) of the active layer AL13 is exposed, a problem of non-radiative surface recombination may occur accordingly. As the size of a mesa-type light emitting structure decreases in order to implement a high resolution with a size of about 60 μm or less, the light emission efficiency may decrease rapidly due to the non-radiative surface recombination. In the present exemplary embodiment, the passivation layer PS13, covering a side surface of the active layer AL13, may be used to suppress/prevent the problem of non-radiative surface recombination.

Figure 11:
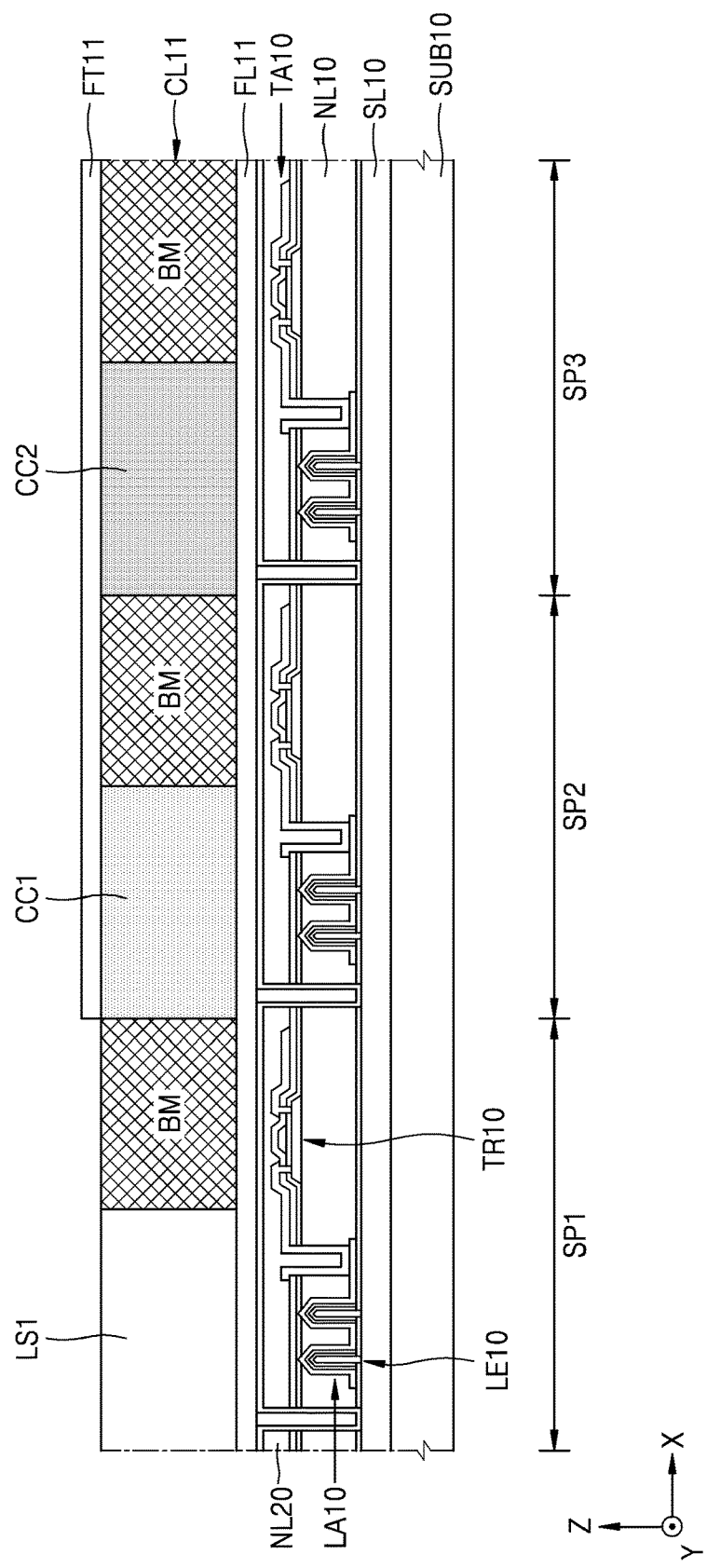
FIG. 11 is a cross-sectional view illustrating a display apparatus according to another exemplary embodiment.

FIG. 11 is a cross-sectional view illustrating a display apparatus according to another exemplary embodiment. The present exemplary embodiment is a modification of FIG. 1 and illustrates a particular embodiment of a color control member CL11.

Referring to FIG. 11, a light emitting element array LA10 including a plurality of light emitting elements LE10, a transistor array TA10 including a plurality of transistors TR10 electrically connected to the plurality of light emitting elements LE10, and a color control member CL11 configured to adjust a color of light generated by the plurality of light emitting elements LE10 may be provided on a substrate SUB10. Also, the display apparatus of the present exemplary embodiment may be divided into a plurality of unit regions SP1, SP2, and SP3. Each of the plurality of unit regions SP1, SP2, and SP3 may correspond to a subpixel. Hereinafter, the first unit region SP1 will be referred to as a first subpixel, the second unit region SP2 will be referred to as a second subpixel, and the third unit region SP3 will be referred to as a third subpixel.

In the present exemplary embodiment, all of the plurality of light emitting elements LE10 may be blue light emitting elements, for example, blue LEDs. In this case, the color control member CL11 may include a blue-to-green color converting element CC1 in a region corresponding to any one of the first to third subpixels SP1 to SP3, for example, the second subpixel SP2. Also, the color control member CL11 may include a blue-to-red color converting element CC2 in a region corresponding to another one of the first to third subpixels SP1 to SP3, for example, the third subpixel SP3. Also, the color control member CL11 may further include a light scattering element LS1 in a region corresponding to another one of the first to third subpixels SP1 to SP3, for example, the first subpixel SP1. The blue-to-green color converting element CC1 may include a photoresist (PR), a first quantum dot (QD), and a light scattering agent, and the blue-to-red color converting element CC2 may include a photoresist (PR), a second quantum dot (QD), and a light scattering agent. The light scattering element LS1 may include a photoresist (PR) and a light scattering agent. The color control member CL11 may include a black matrix (BM) pattern between the color converting elements CC1 and CC2 and the light scattering element LS1. The black matrix (BM) pattern may function as a kind of partition wall (barrier).

Consequently, the first subpixel SP1 may be a blue (B) subpixel, the second subpixel SP2 may be a green (G) subpixel, and the third subpixel SP3 may be a red (R) subpixel. Thus, a full-color display may be implemented by using the R/G/B.

The display apparatus of the present embodiment may further include a blue cut filter (BCF) FT11 covering the blue-to-green color converting element CC1 and the blue-to-red color converting element CC2 on the color control member CL11. The BCF FT11 may not transmit (e.g., may reflect) blue wavelengths (about 400 nm to about 500 nm) and may transmit only wavelength bands other than a blue wavelength band. Thus, in the region of the second and third subpixels SP2 and SP3, the emission of blue light not reacting with the color converting elements CC1 and CC2 may be more securely blocked by the BCF FT11.

Also, the display apparatus may further include a yellow recycling film (YRF) FL11 provided between the color control member CL11 and the light emitting element array LA10. The YRF FL11 may be provided on the transistor array TA10 and may be formed throughout the region of the first to third subpixels SP1 to SP3. The YRF FL11 may transmit blue wavelengths and may reflect green wavelengths and red wavelengths. For example, the YRF FL11 may transmit a wavelength band of about 500 nm or less and may reflect a wavelength band of about 500 nm to about 790 nm. Thus, the blue light generated by the plurality of light emitting elements LE10 may be irradiated onto the light scattering element LS1, the blue-to-green color converting element CC1, and the blue-to-red color converting element CC2 through the YRF FL11. Also, the green light and the red light emitted downward from the blue-to-green color converting element CC1 and the blue-to-red color converting element CC2 may be reflected by the YRF FL11 and then emitted upward. The light efficiency may be improved by the YRF FL11.

At least one of the BCF FT11 and the YRF FL11 may be formed, for example, in a distributed Bragg reflector (DBR) structure. By repeatedly stacking two material layers (dielectrics) having different refractive indexes and adjusting the thicknesses of material layers and the number of stacked layers, a DBR structure capable of transmitting or reflecting only a desired wavelength band may be made, and the DBR structure may be applied to the BCF FT11 or the YRF FL11. For example, a $SiO_2$ layer and a $TiO_2$ layer may be repeatedly stacked under $\lambda/4$ conditions (where $\lambda$ is the wavelength of light), and the reflectance or transmittance of a desired wavelength band may be increased by adjusting the thicknesses of layers and the number of stacked layers. Since the DBR structure is well known in the art, detailed descriptions thereof will be omitted for conciseness. Also, at least one of the BCF FT11 and the YRF FL11 may have another structure (e.g., a high-contrast grating (HCG) structure) other than the DBR structure. In addition, the configurations of the BCF FT11 and the YRF FL11 may be modified in any of various ways.

Each of the BCF FT11 and the YRF FL11 may have a substantially flat layer structure. The color control member CL11 therebetween may also have a substantially flat layer structure. When the BCF FT11 and the YRF FL11 have a substantially flat layer structure, the height difference (step difference) in their effective regions may be less than about 20 nm, less than about 10 nm, or less than about 5 nm. This may also be true for the color control member CL11. When the BCF FT11 and the YRF FL11 have a flat layer structure, it may be advantageous for implementation of excellent characteristics. In particular, if the BCF FT11 and the YRF FL11 are formed in a multi-layer structure such as a DBR structure, when they have a flat layer structure, desired characteristics may be easily implemented. Likewise, when the color control member CL11 has a flat layer structure, it may be advantageous for implementation of excellent color control characteristics. In the present exemplary embodiments, the color control member and the optical film/filter provided thereon/thereunder may have a flat layer structure and thus may be advantageous for implementation of excellent characteristics.

The YRF FL11 may be referred to as a first optical film for transmitting a first wavelength band of light and reflecting a second wavelength band of light, and the BCF FT11 may be referred to as a second optical film for blocking a first wavelength band of light transmitted by the YRF FL11 and transmitting a second wavelength band of light reflected by the YRF FL11.

Figure 12:
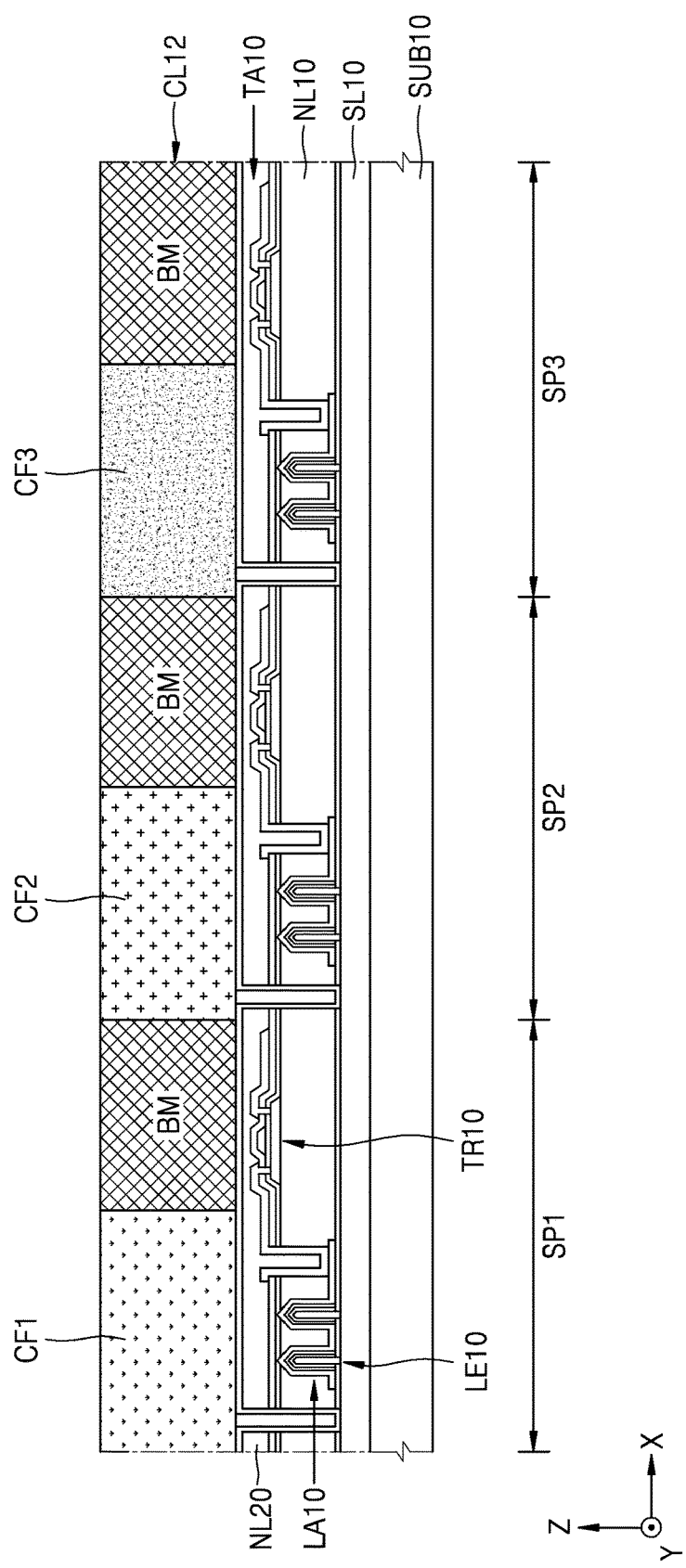
FIG. 12 is a cross-sectional view illustrating a display apparatus according to another exemplary embodiment.

FIG. 12 is a cross-sectional view illustrating a display apparatus according to another exemplary embodiment.

Referring to FIG. 12, all of a plurality of light emitting elements LE10 may be white light emitting elements, for example, white LEDs. In this case, a color control member CL12 may include a blue color filter CF1 in a region corresponding to any one of the first to third subpixels SP1 to SP3, for example, the first subpixel SP1. Also, the color control member CL12 may further include a green color filter CF2 in a region corresponding to another one of the first to third subpixels SP1 to SP3, for example, the second subpixel SP2. Also, the color control member CL12 may include a red color filter CF3 in a region corresponding to another one of the first to third subpixels SP1 to SP3, for example, the third subpixel SP3. The blue color filter CF1 may selectively transmit a blue light, the green color filter CF2 may selectively transmit a green light, and the red color filter CF3 may selectively transmit a red light. A black matrix (BM) pattern may be provided between and around the filters CF1 to CF3.

FIG. 11 illustrates the configuration and combination of the color control member CL11 for implementing RGB when a blue light emitting element is used, and FIG. 12 illustrates the configuration and combination of the color control member CL12 for implementing RGB when a white light emitting element is used. However, those described with reference to FIGS. 11 and 12 are merely examples and may be modified in any of various ways. The color of light generated by the plurality of light emitting elements may vary according to embodiments, and the combination or arrangement of subpixels by the color control member may be modified in any of various ways.

Figure 13:
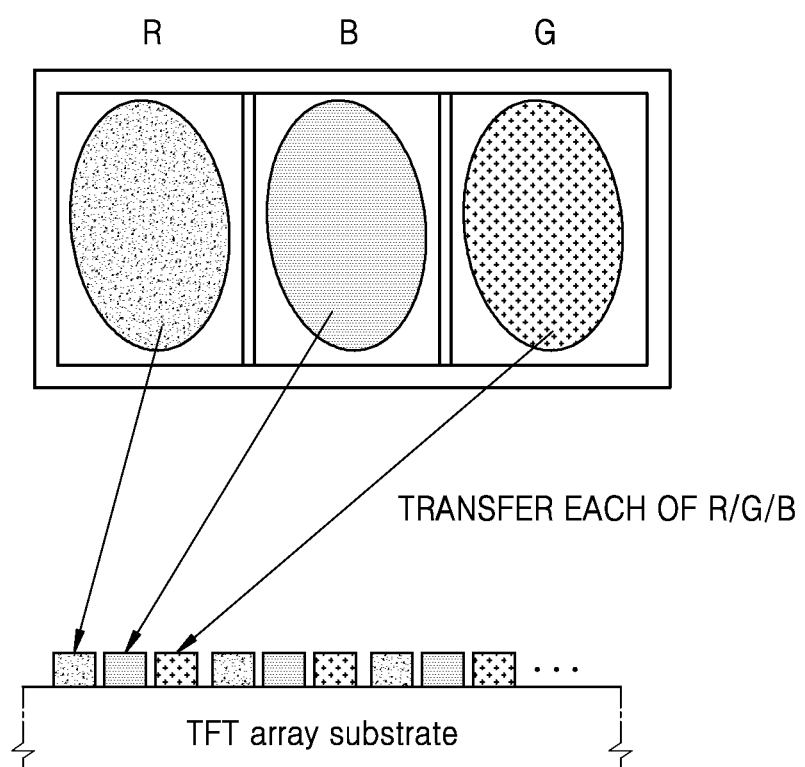
FIG. 13 is a diagram illustrating a display apparatus according to a comparative example.

FIG. 13 is a diagram illustrating a display apparatus according to a comparative example.

Referring to FIG. 13, according to a comparative example, each of a red (R) subpixel, a green (G) subpixel, and a blue (B) subpixel may be transferred onto a TFT array substrate. Since a transfer process is performed, high resolution implementation may be difficult and a process thereof may be difficult. A pixel resolution of about 250 μm is expected.

Figure 14:
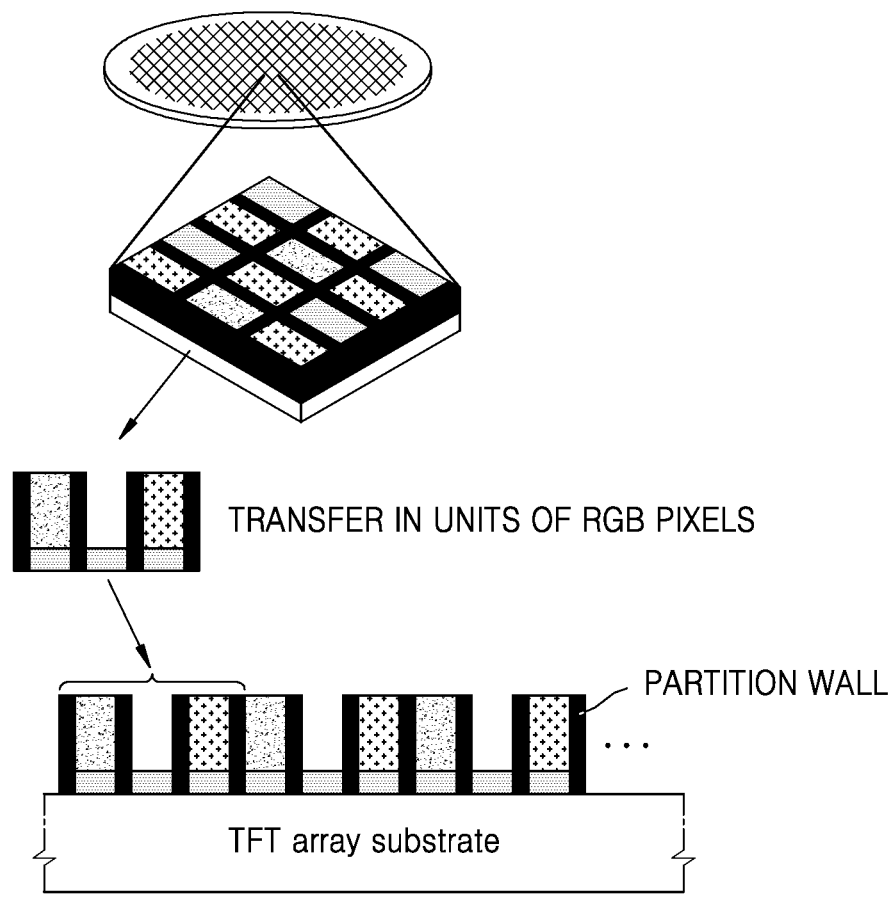
FIG. 14 is a diagram illustrating a display apparatus according to another comparative example.

FIG. 14 is a diagram illustrating a display apparatus according to another comparative example.

Referring to FIG. 14, RGB pixels are formed on a first substrate (wafer), and then they are transferred onto a TFT array substrate in units of RGB pixels. Since this comparative example also uses a transfer process, high resolution implementation may be difficult.

In the present exemplary embodiments, the light emitting element array LA10, the transistor array TA10, and the color control member CL10 may be monolithically provided on one substrate SUB10. Thus, a display apparatus having a high resolution may be easily manufactured without using a transfer process. For example, a display apparatus having a high resolution of about 100 PPI (pixels per inch) or more may be easily implemented. Since the light emitting element array LA10 may be constructed using nanosized inorganic material-based light emitting elements, it may be possible to implement a display apparatus having excellent characteristics in various aspects such as brightness, resolution, contrast ratio, lifetime, multi-depth, form factor, color purity, and power efficiency, even in small sizes.

Figure 15:
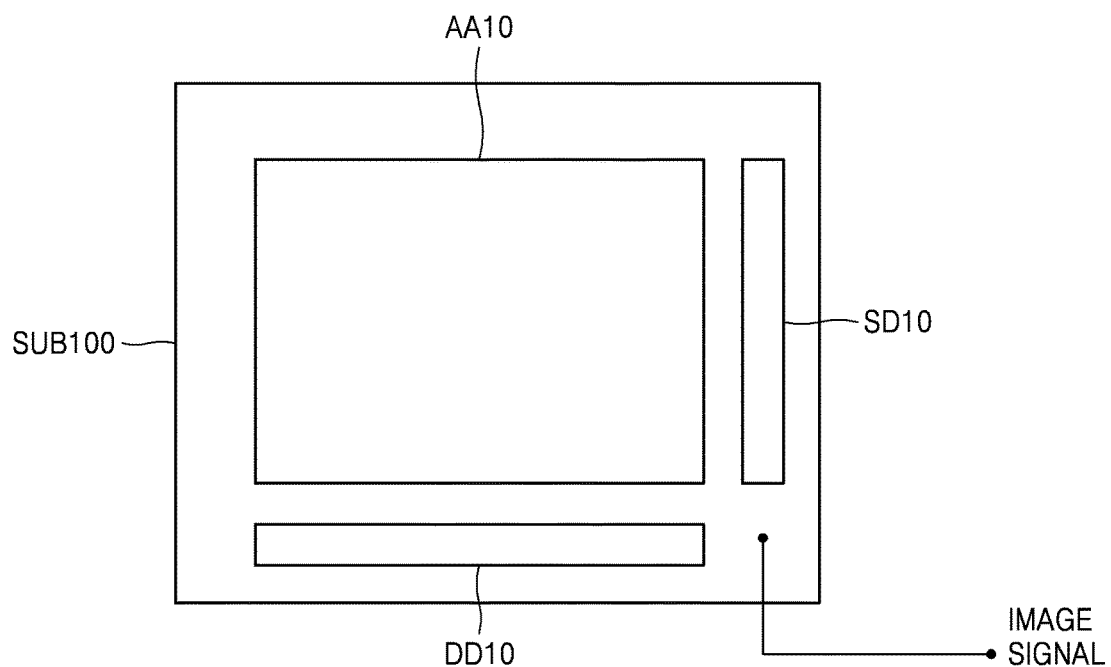
FIG. 15 is a plan view illustrating a display apparatus according to another exemplary embodiment.

FIG. 15 is a plan view illustrating a display apparatus according to another exemplary embodiment.

Referring to FIG. 15, a display apparatus may include an active region AA10 provided on a substrate SUB100. The active region AA10 may include a light emitting element array, a transistor array, and a color control member. The substrate SUB100 and the active region AA10 may have the structures described with reference to FIGS. 1, 11, and 12. As an example, the substrate SUB100 may correspond to the substrate SUB10 of FIG. 1, and the active region AA10 may include the light emitting element array LA10, the transistor array TA10, and the color control member CL10 of FIG. 1.

The display apparatus of the present exemplary embodiment may further include a scan driver SD10 and a data driver DD10 connected to the active region AA10. The scan driver SD10 and the data driver DD10 may be monolithically provided on the substrate SUB100 together with the active region AA10. Since the active region AA10, the scan driver SD10, and the data driver DD10 may be monolithically provided on a single substrate SUB100, the system and overall structure of the display apparatus may be simplified and the manufacturing process thereof may also be simplified.

In addition, an image signal processor (not illustrated) electrically connected to the display apparatus may be further provided. The image signal processor may be provided as a separate chip with respect to the display apparatus, and they may be electrically connected to each other. Image signals may be input/output between the display apparatus and the image signal processor.

According to another exemplary embodiment, the image signal processor may be provided on the substrate SUB100. An example thereof is illustrated in FIG. 16.

Figure 16:
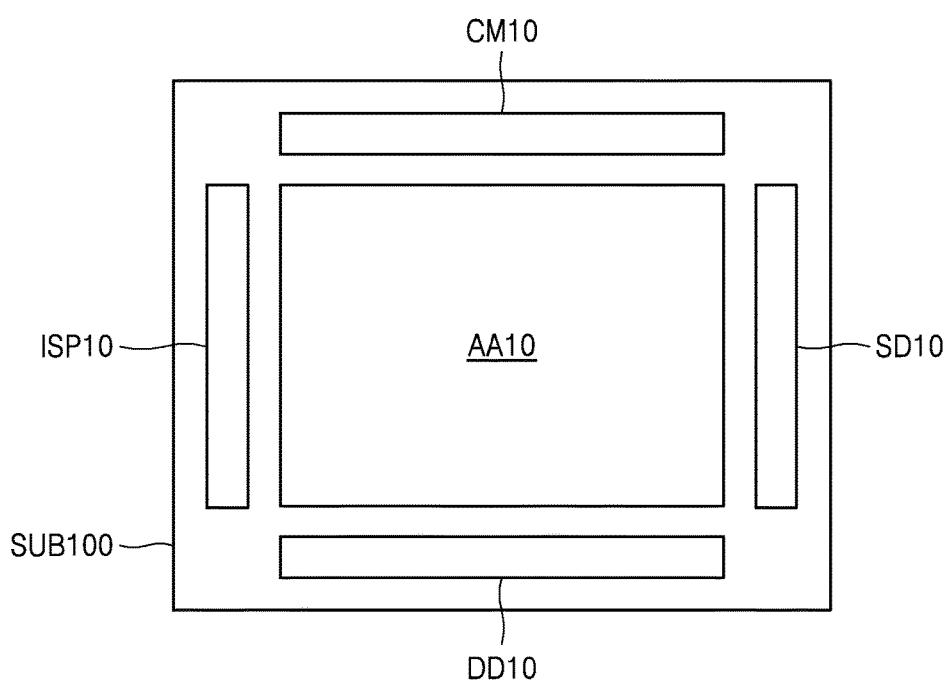
FIG. 16 is a plan view illustrating a display apparatus according to another exemplary embodiment.

FIG. 16 is a plan view illustrating a display apparatus according to another exemplary embodiment.

Referring to FIG. 16, a display apparatus may further include an image signal processor ISP10 provided on a substrate SUB100. Also, the display apparatus may further include a communication part (communication unit or communicator) CM10 provided on the substrate SUB100. The image signal processor ISP10 and the communication part CM10 may be monolithically provided on the substrate SUB100 together with the active region AA10, the scan driver SD10, and the data driver DD10. The communication part CM10 may communicate signals with an external apparatus (not illustrated). The communication part CM10 may include at least one of a radio frequency (RF) signal receiver, an antenna, a Bluetooth apparatus, and a Wi-Fi apparatus.

As described with reference to FIGS. 15 and 16, a display apparatus according to exemplary embodiments may have an almost fully monolithic configuration or a fully monolithic configuration. Thus, a system and an overall structure of the display apparatus may be simplified. Also, a manufacturing process thereof may be simplified.

The display apparatuses according to the above exemplary embodiments may be usefully applied to any of various apparatuses such as wearable apparatuses or portable apparatuses. For example, the above display apparatuses may be applied to head-mounted displays (HMDs) such as glasses-type displays or goggle-type displays. Also, the above display apparatuses may be applied to virtual reality (VR) displays or augmented reality (AR) displays requiring micro-displays having high resolution and high brightness.

A micro-display may have a size of about 6 inches or less. Since the display apparatuses according to the present exemplary embodiments may be easily manufactured in small size/volume and may exhibit high-resolution and high-brightness performance even in small size, they may be usefully applied to micro-displays for implementation of AR or VR and may also be usefully applied to display apparatuses for implementation of three-dimensional images as well as two-dimensional images. In addition, the above display apparatuses may be applied to projection displays having smaller volume than liquid crystal on silicon (LCOS) displays.

Figure 17:
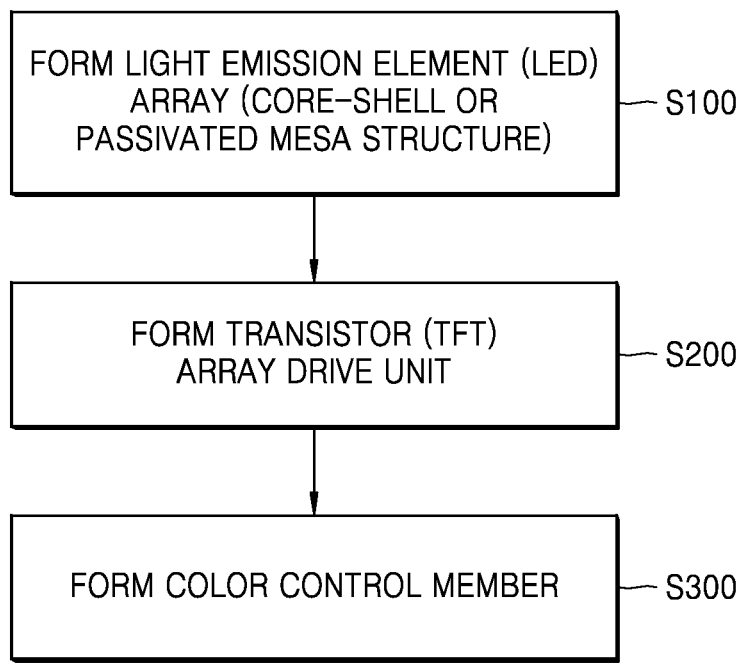
FIG. 17 is a flowchart illustrating a method of manufacturing a display apparatus, according to an exemplary embodiment.

FIG. 17 is a flowchart illustrating a method of manufacturing a display apparatus according to an exemplary embodiment.

Referring to FIG. 17, a light emitting element array including a plurality of light emitting elements may be formed on a substrate (operation S100). The plurality of light emitting elements may include a vertical light emitting structure (nanostructure) having a core-shell structure or may include a mesa-type light emitting structure having a passivation layer on a side surface thereof.

Thereafter, a transistor array including a plurality of transistors may be formed on the substrate (operation S200). The plurality of transistors may be thin film transistors (TFTs) electrically connected to the plurality of light emitting elements.

Thereafter, a color control member may be formed on the substrate (operation S300). The color control member may be provided on the plurality of light emitting elements and the plurality of transistors and may have a configuration for adjusting the color of light generated by the plurality of light emitting elements. The color control member may include a quantum dot (QD)-based color converter or a color filter.

The light emitting element array, the transistor array, and the color control member may be monolithically formed on one substrate. Since there is no transfer process, the size of a pixel and the distance between pixels may be easily reduced, a manufacturing process thereof may be simplified, and a display apparatus having a high resolution may be easily manufactured.

FIGS. 18(A) and 18(B) through 22(A) and 22(B) are diagrams illustrating a method of forming a plurality of light emitting elements in a method of manufacturing a display apparatus according to an exemplary embodiment. Each of FIGS. 18(A), 19(A), 20(A), 21(A), and 22(A) is a cross-sectional view, and each of FIGS. 18(B), 19(B), 20(B), 21(B), and 22(B) is a plan view, respectively corresponding thereto.

Figure 18B:
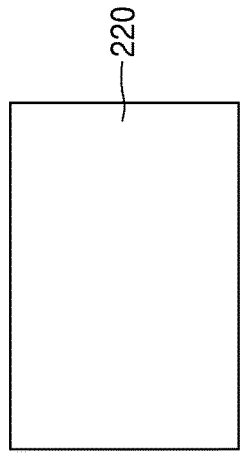
Figure 18A:
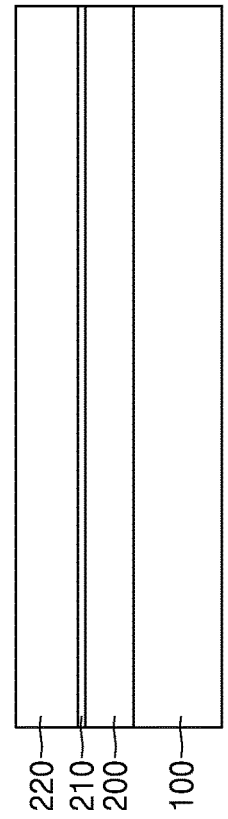

Referring to FIGS. 18(A) and 18(B), a semiconductor layer 200 may be formed on a substrate 100. The substrate 100 may be any one of various substrates such as a sapphire ($Al_2O_3$) substrate, a Si substrate, a SiC substrate, an amorphous AlN substrate, and a Si—Al substrate. The semiconductor layer 200 may be, for example, an n-type semiconductor layer or may be a p-type semiconductor layer in some cases. The semiconductor layer 200 may have a single-layer structure or a multi-layer structure. The semiconductor layer 200 may include a III-V group-based n-type semiconductor, for example, n-GaN.

A first insulating layer 210 may be formed on the semiconductor layer 200, and a second insulating layer 220 may be formed on the first insulating layer 210. The first insulating layer 210 and the second insulating layer 220 may be formed of different materials. As an example, the first insulating layer 210 may be formed of a silicon nitride, and the second insulating layer 220 may be formed of a silicon oxide. However, this is merely an example, and the materials of the first and second insulating layers 210 and 220 may be modified according to various embodiments. The second insulating layer 220 may have a thickness larger than that of the first insulating layer 210. When appropriate, a chemical mechanical polishing (CMP) process may be performed on a surface portion (top surface portion) of the second insulating layer 220.

Figure 19B:
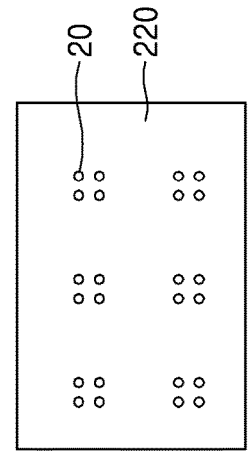
Figure 19A:
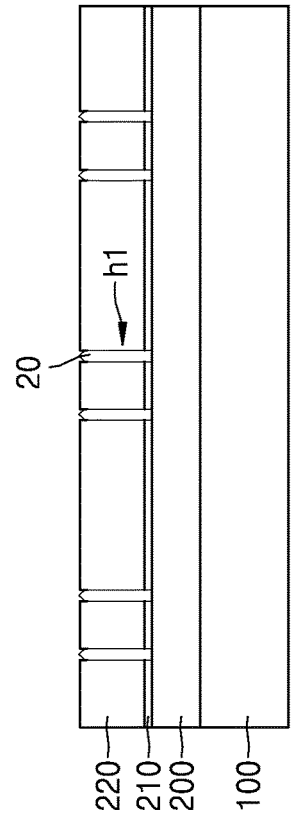

Referring to FIGS. 19(A) and 19(B), a plurality of holes h1, exposing the semiconductor layer 200, may be formed by etching predetermined regions of the first insulating layer 210 and the second insulating layer 220, and a first conductivity type semiconductor 20 may be grown from the semiconductor layer 200 exposed by the plurality of holes h1. Thus, the plurality of holes h1 may be filled with the first conductivity type semiconductor 20. Thereafter, the second insulating layer 220 may be removed. Only the second insulating layer 220 may be selectively removed by an etch selectivity between the second insulating layer 220 and the first insulating layer 210. A resulting structure thereof is illustrated in FIGS. 20(A) and 20(B).

Figure 20B:
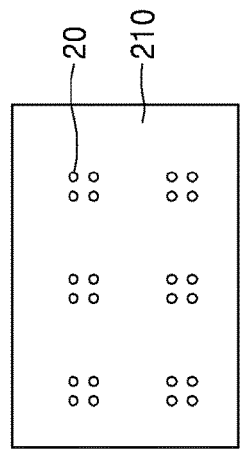
Figure 20A:
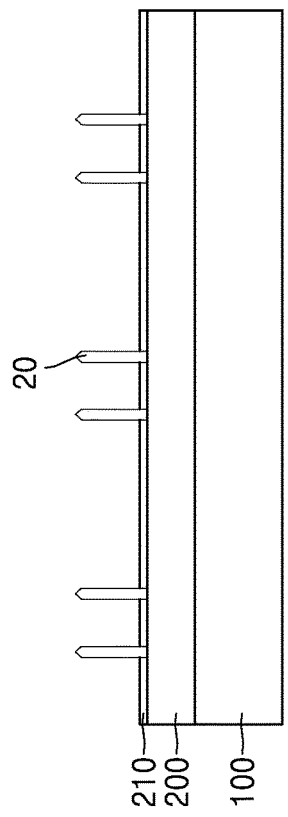

Referring to FIGS. 20(A) and 20(B), a plurality of first conductivity type semiconductors 20 may be arranged to form an array. The plurality of first conductivity type semiconductors 20 may be divided into a plurality of groups, and each group may include at least one first conductivity type semiconductor 20. A plurality of first conductivity type semiconductors 20 may be provided in each group.

Figure 21B:
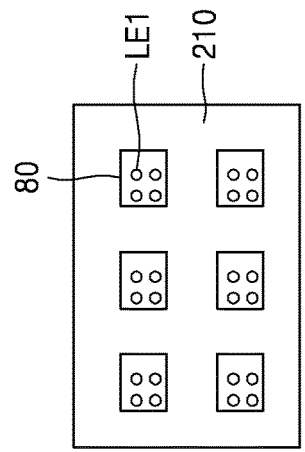
Figure 21A:
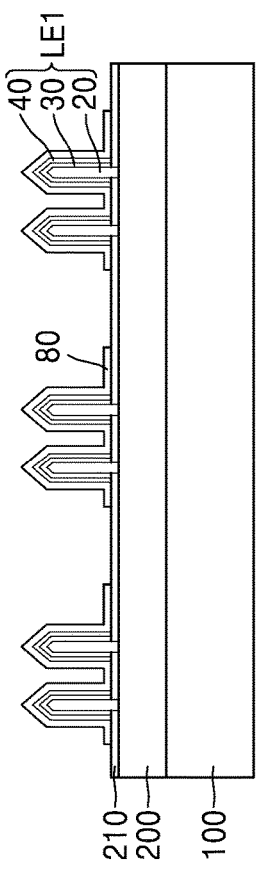

Referring to FIGS. 21(A) and 21(B), an active layer 30, covering each of the first conductivity type semiconductors 20, may be formed, and a second conductivity type semiconductor 40 covering the active layer 30 may be formed. The first conductivity type semiconductor 20 may be an n type and the second conductivity type semiconductor 40 may be a p type, or vice versa. The active layer 30 may include a light emitting layer. The active layer 30 may have a single-quantum well (SQW) structure or a multi-quantum well (MQW) structure. At least one of the first conductivity type semiconductor 20, the active layer 30, and the second conductivity type semiconductor 40 may include a III-V group-based semiconductor. As an example, the first conductivity type semiconductor 20 may include an n-GaN-based material, the second conductivity type semiconductor 40 may include a p-GaN-based material, and the active layer 30 may have a GaN-based MQW structure. In this case, the first conductivity type semiconductor 20, the active layer 30, and the second conductivity type semiconductor 40 may be formed by an epitaxy process. Each of the first conductivity type semiconductors 20 and the active layer 30 and the second conductivity type semiconductor 40 covering the first conductivity type semiconductors 20 may be referred to as constituting one light emitting element LE1. The light emitting element LE1 may correspond to the light emitting element LE11 described with reference to FIG. 8.

A plurality of light emitting elements LE1 may be arranged to form an array. A plurality of light emitting elements LE1 may be divided into a plurality of groups, and each group may include two or more light emitting elements LE1. A first electrode 80 contacting the light emitting elements LE1 of each group may be formed. The first electrode 80 may be formed of a transparent conductive material. For example, the first electrode 80 may be formed of a transparent conductive oxide such as an indium tin oxide (ITO).

Referring to FIGS. 22(A) and 22(B), a third insulating layer 300 covering the plurality of light emitting elements LE1 and the first electrode 80 may be formed. By forming an insulating material layer covering the plurality of light emitting elements LE1 and the first electrode 80 on the first insulating layer 210 and then performing a chemical mechanical polishing (CMP) process on the insulating material layer, the third insulating layer 300 having a flat surface (or a substantially flat surface) may be obtained. The third insulating layer 300 may be formed of, for example, a silicon oxide; however, the material may vary according to embodiments. A surface (top surface) of the third insulating layer 300 may have a height that is equal or similar to the height of a portion of the first electrode 80 formed on the plurality of light emitting elements LE1. In some cases, a portion of the end of the first electrode 80 may somewhat protrude with respect to the third insulating layer 300. Alternatively, in order to completely cover the first electrode 80, the third insulating layer 300 may have a height greater than that of the first electrode 80.

FIGS. 23(A) and (B) through 26(A) and (B) are diagrams illustrating a method of forming a plurality of light emitting elements in a method of manufacturing a display apparatus according to another exemplary embodiment. Each of FIGS. 23(A), 24(A), 25(A) and 26(A) is a cross-sectional view, and each of FIGS. 23(B), 24(B), 25(B), and 26(B) is a plan view, respectively corresponding thereto.

Referring to FIGS. 23(A) and 23(B), a semiconductor layer 201 may be formed on a substrate 101. The substrate 101 and the semiconductor layer 201 may be identical or similar to the substrate 100 and the semiconductor layer 200 described with reference to FIG. 18. A first insulating layer 211 may be formed on the semiconductor layer 201. For example, the first insulating layer 211 may be formed of, for example, a silicon oxide; however, the material is not limited thereto. Also, although the first insulating layer 211 is illustrated as a single-layer structure, it may be formed as a multi-layer structure in some cases. As an example, the first insulating layer 211 may have a double-layer structure formed of different insulating materials. In this case, the first insulating layer 211 may include a silicon nitride layer and a silicon oxide layer that are sequentially stacked.

Referring to FIGS. 24(A) and 24(B), a plurality of holes h2 exposing the semiconductor layer 201 may be formed by etching predetermined regions of the first insulating layer 211, and a first conductivity type semiconductor 21 may be grown from the semiconductor layer 201 exposed by the plurality of holes h2. In this case, the first conductivity type semiconductor 21 may be grown to extend above the height of the hole h2.

The first conductivity type semiconductor 21 may include a first portion 21A provided in the hole h2 and a second portion 21B protruding above the hole h2. The second portion 21B may be grown upward from the first portion 21A. The first portion 21A may have a nanowire shape, and the second portion 21B may have a nanopyramid shape or a similar shape.

Referring to FIGS. 25(A) and 25(B), an active layer 31 covering the second portion 21B of the first conductivity type semiconductors 21 may be formed, and a second conductivity type semiconductor 41 covering the active layer 31 may be formed. The materials of the first conductivity type semiconductor 21, the active layer 31, and the second conductivity type semiconductor 41 may be identical or similar to the materials of the first conductivity type semiconductor 20, the active layer 30, and the second conductivity type semiconductor 40 described with reference to FIGS. 21(A) and 21(B). Each of the first conductivity type semiconductors 21 and the active layer 31 and the second conductivity type semiconductor 41 covering the first conductivity type semiconductors 21 may be referred to as constituting one light emitting element LE2. The light emitting element LE2 may correspond to the light emitting element LE12 described with reference to FIG. 9.

A plurality of light emitting elements LE2 may be arranged to form an array. A plurality of light emitting elements LE2 may be divided into a plurality of groups, and each group may include two or more light emitting elements LE2. A first electrode 81 contacting the light emitting elements LE2 of each group may be formed.

Figure 26A:
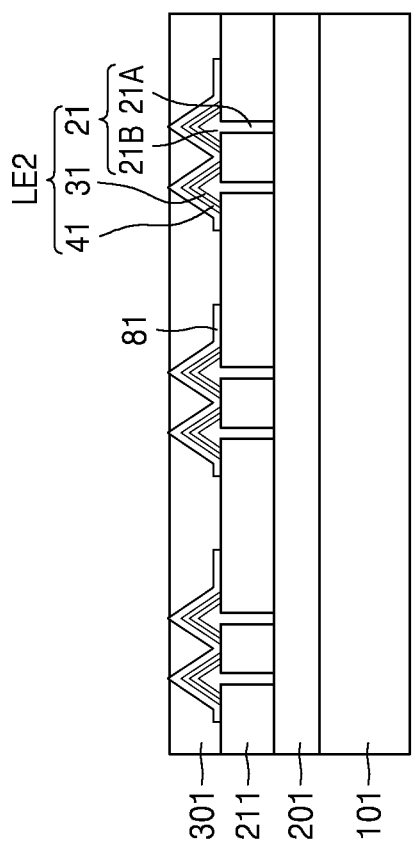
Figure 26B:
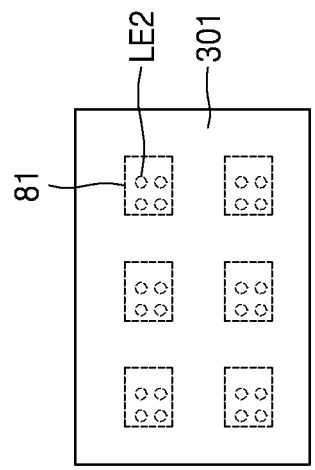

Referring to FIGS. 26(A) and 26(B), a second insulating layer 301 covering the plurality of light emitting elements LE2 and the first electrode 81 may be formed. By forming an insulating material layer covering the plurality of light emitting elements LE2 and the first electrode 81 on the first insulating layer 211 and then performing a CMP process on the insulating material layer, the second insulating layer 301 having a flat surface (or a substantially flat surface) may be obtained. A surface (top surface) of the second insulating layer 301 may have a height that is equal or similar to the height of a portion of the first electrode 81 formed on the plurality of light emitting elements LE2. The second insulating layer 301 may be formed of, for example, a silicon oxide; however, the material may vary according to embodiments.

FIGS. 27 to 30 are cross-sectional views illustrating a method of forming a plurality of light emitting elements in a method of manufacturing a display apparatus according to another exemplary embodiment.

Figure 27:
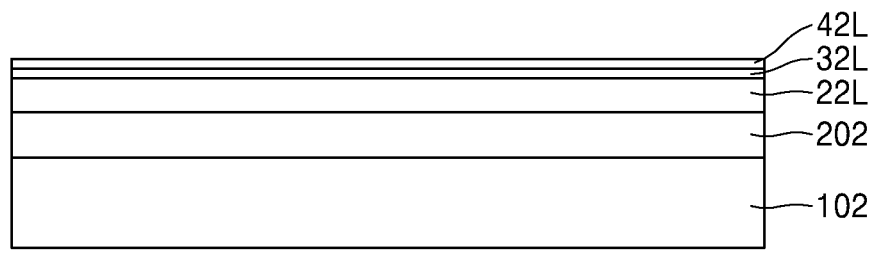
FIGS. 27 to 30 are cross-sectional views illustrating a method of forming a plurality of light emitting elements in a method of manufacturing a display apparatus, according to another exemplary embodiment.

Referring to FIG. 27, a semiconductor layer 202 may be formed on a substrate 102. A first conductivity type semiconductor 22L, an active layer 32L, and a second conductivity type semiconductor 42L may be sequentially formed on the semiconductor layer 202. The first conductivity type semiconductor 22L, the active layer 32L, and the second conductivity type semiconductor 42L may have a layered structure parallel to the semiconductor layer 202.

Figure 28:
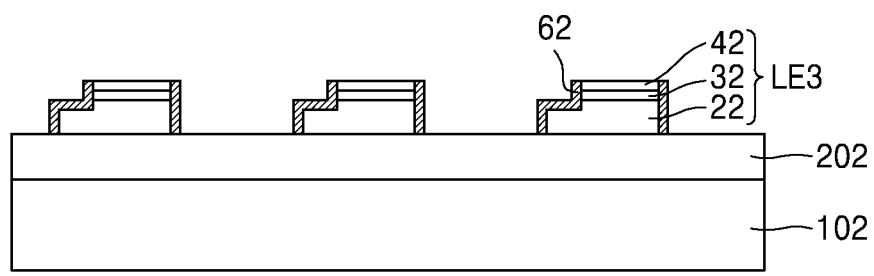

Referring to FIG. 28, a plurality of mesa-type light emitting elements LE3 may be formed by patterning the second conductivity type semiconductor 42L, the active layer 32L, and the first conductivity type semiconductor 22L. Reference numerals 22, 32, and 42 denote a patterned first conductivity type semiconductor, a patterned active layer, and a patterned second conductivity type semiconductor, respectively.

Thereafter, a passivation layer 62 covering a side surface of the mesa-type light emitting element LE3 may be formed. The passivation layer 62 may be formed of an insulator or a semiconductor such as p-GaN, $SiO_2$, $Si_3N_4$, or $Al_2O_3$. A problem of non-radiative surface recombination may be suppressed or prevented by the passivation layer 62 covering a side surface of the active layer 32. The mesa-type light emitting element LE3 having the passivation layer 62 on a side surface thereof may correspond to the light emitting element LE13 described with reference to FIG. 10.

Figure 29:
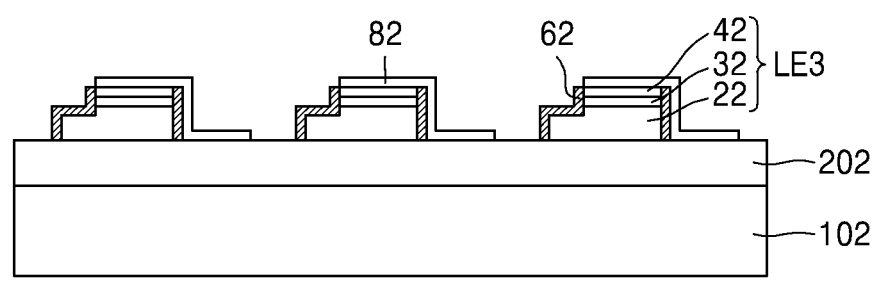

Referring to FIG. 29, a first electrode 82 contacting the second conductivity type semiconductor 42 may be formed. The first electrode 82 may be formed of a transparent conductive material and may be formed to extend to one side of the light emitting element LE3, as shown.

Figure 30:
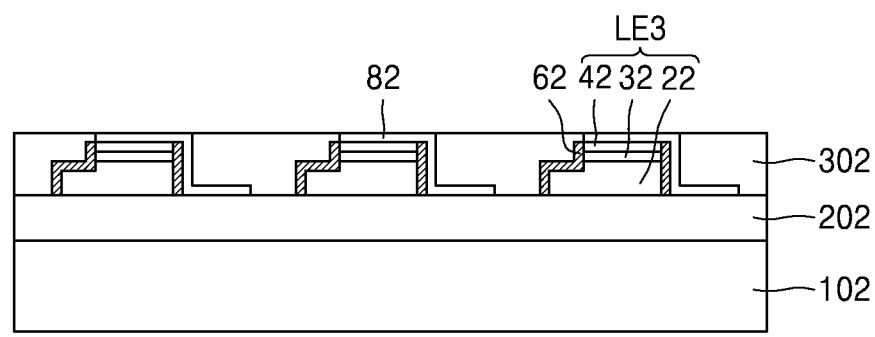

Referring to FIG. 30, an insulating layer 302 covering the plurality of light emitting elements LE3 and the first electrode 82 may be formed. A method of forming the insulating layer 302 may be similar to a method of forming the second insulating layer 301 of FIGS. 26(A) and 26(B).

In the present exemplary embodiment, the formation range and the shape of the first electrode 82 may vary, and the first electrode 82 may be omitted in some cases. When the first electrode 82 omitted, a conductive plug (not illustrated) directly contacting the second conductivity type semiconductor 42 may be formed in a subsequent process.

In the methods of forming a plurality of light emitting elements described with reference to FIGS. 18(A) and 18(B) through 22(A) and 22(B), FIGS. 23(A) and 23(B) through 26(A) and 26(B), and FIGS. 27 to 30, at least two light emitting elements may be connected to each other to have a connected (continuous) structure. For example, in FIGS. 21(A) and 21(B), the active layer 30 and the second conductivity type semiconductor 40 may have a continuous layer structure to cover a region of the plurality of light emitting elements LE1, instead of being patterned in units of each of the light emitting element LEL Likewise, in FIGS. 25(A) and 25(B), the active layer 31 and the second conductivity type semiconductor 41 may have a continuous layer structure to cover a region of the plurality of light emitting elements LE2. Also, in the case of the mesa-type light emitting element LE3 of FIG. 28, the first conductivity type semiconductor 22 may have a continuous layer structure to connect the regions of the plurality of light emitting elements LE3. For example, by not patterning the first conductivity type semiconductor 22L of FIG. 27 or by patterning (etching) a portion of the top thereof, the patterned active layer 32 and the patterned second conductivity type semiconductor 42 may be formed on the first conductivity type semiconductor having a continuous layer structure. In this case, the semiconductor layer 202 may not be formed.

FIGS. 31 to 35 are plan views illustrating a method of forming a transistor array in a method of manufacturing a display apparatus according to an exemplary embodiment.

Figure 31:
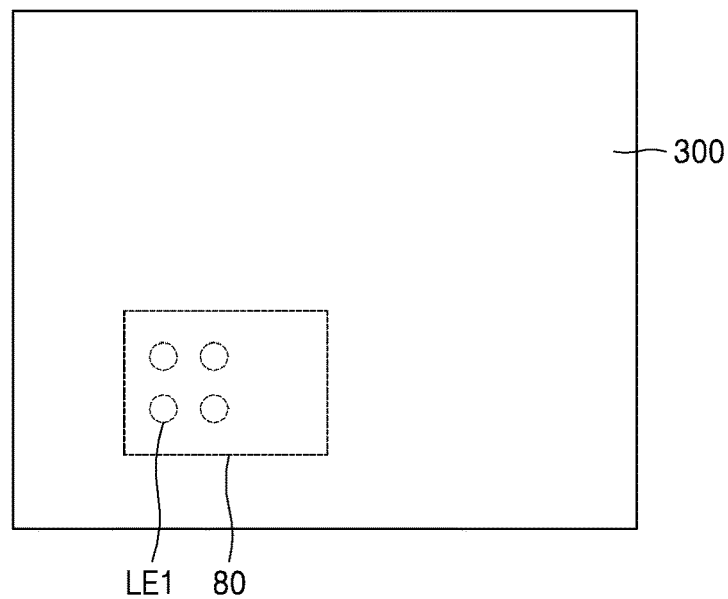
FIGS. 31 to 35 are plan views illustrating a method of forming a transistor array in a method of manufacturing a display apparatus, according to an exemplary embodiment.

Referring to FIG. 31, a region corresponding to one unit region of FIG. 22(B) may be prepared. Thus, a first group of light emitting elements LE1 and a first electrode 80 covering the first group of light emitting elements LE1 may be provided, and a third insulating layer 300 covering the first group of light emitting elements LE1 and the first electrode 80 may be provided.

Figure 32:
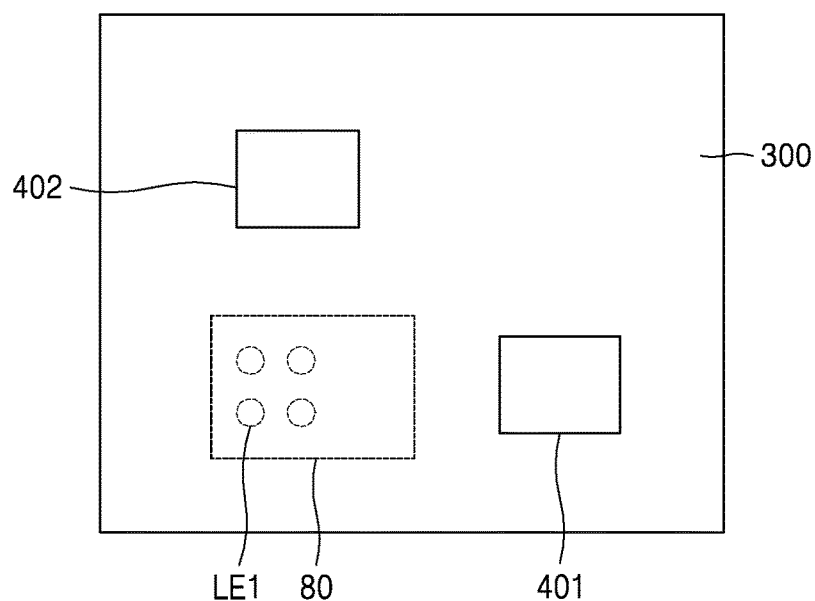

Referring to FIG. 32, a first channel layer 401 and a second channel layer 402 may be formed on the third insulating layer 300. The first and second channel layers 401 and 402 may be spaced apart from the first electrode 80. The first and second channel layers 401 and 402 may include polycrystalline silicon (poly-Si) or amorphous silicon (a-Si), or may include at least one of an oxide semiconductor, a nitride semiconductor, and an oxynitride semiconductor. However, the above channel layer materials are merely examples, and other channel layer materials may be used. For example, the first and second channel layers 401 and 402 may include a III-V group-based semiconductor (e.g., GaN), monocrystalline silicon, or an organic semiconductor.

Figure 33:
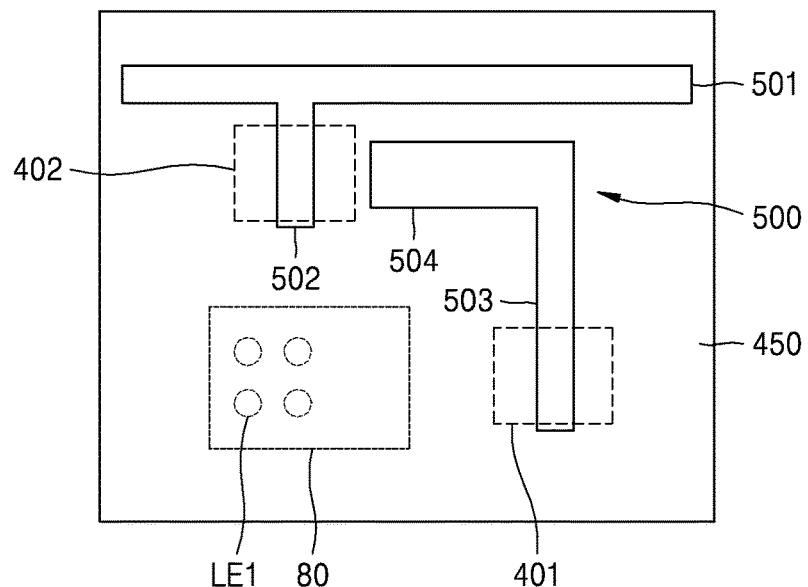

Referring to FIG. 33, a fourth insulating layer 450 covering the first and second channel layers 401 and 402 may be formed on the third insulating layer 300 (see FIG. 32). The fourth insulating layer 450 may be a gate insulating layer. Thereafter, a first conductive line pattern 500 may be formed on the fourth insulating layer 450. The conductive line pattern 500 may include a scan line 501, a first gate electrode 503, a second gate electrode 502, and a first conductor 504. The first gage electrode 503 may be disposed on the first channel layer 401, and the second gage electrode 502 may be disposed on the second channel layer 402. The second gate electrode 502 may be a portion protruding from the scan line 501 in a direction perpendicular thereto. The first conductor 504 may be disposed near the second channel layer 402 and may be connected to the gate electrode 503. The first conductor 504 and the first gate electrode 503 may form a bent structure (e.g., an L-shaped structure).

Figure 34:
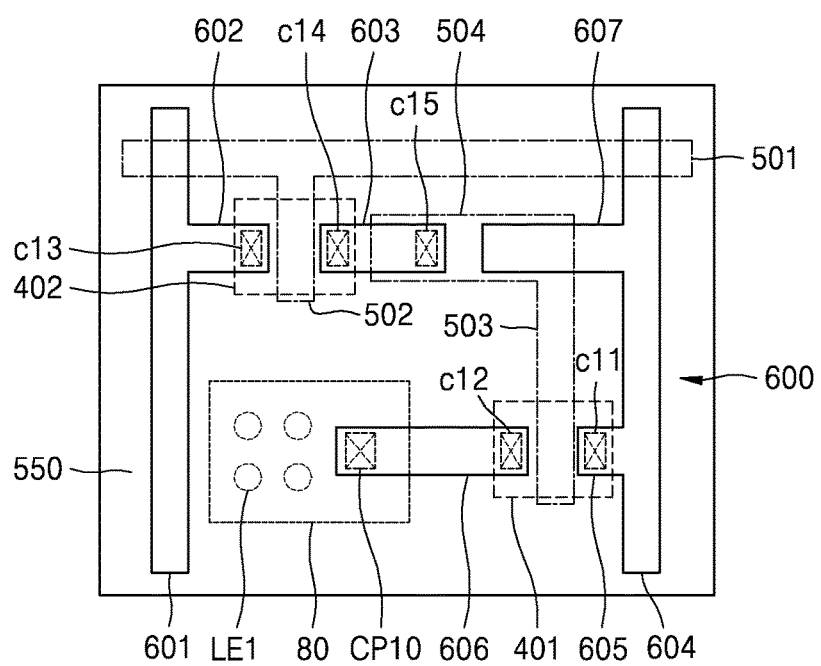

Referring to FIG. 34, a fifth insulating layer 550 covering the first conductive line pattern 500 may be formed on the fourth insulating layer 450 (see FIG. 33). A second conductive line pattern 600 may be formed on the fifth insulating layer 550. The second conductive line pattern 600 may include a data line 601, a voltage source line 604, a first source electrode 605, a first drain electrode 606, a second source electrode 602, a second drain electrode 603, and a second conductor 607. The arrangement of and relationships among the data line 601, the voltage source line 604, the first source electrode 605, the first drain electrode 606, the second source electrode 602, the second drain electrode 603, and the second conductor 607 may be the same as those described with reference to FIG. 3B.

The first drain electrode 606 may be connected to the first electrode 80 through a first conductive plug CP10. The first conductive plug CP10 may be provided in a via hole. Reference numerals cll and c12 denote contact portions connecting the first channel layer 401 to the first source electrode 605 and the first drain electrode 606, reference numerals c13 and c14 denote contact portions connecting the second channel layer 402 to the second source electrode 602 and the second drain electrode 603, and a reference numeral c15 denotes a contact portion connecting the first conductor 504 to the second drain electrode 603.

Figure 35:
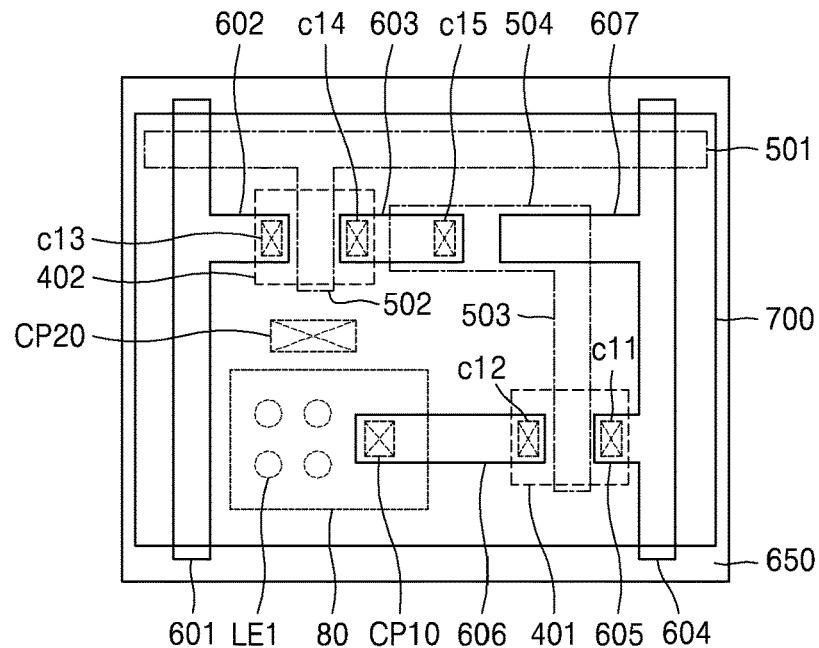

Referring to FIG. 35, a sixth insulating layer 650, covering the second conductive line pattern 600, may be formed on the fifth insulating layer 550 (see FIG. 34). An insulating material layer covering the second conductive line pattern 600 may be formed, and then a CMP process may be performed to obtain the sixth insulating layer 650 having a flat surface (or a substantially flat surface). When the sixth insulating layer 650 has a substantially flat surface, the height difference (step difference) in the surface may be less than about 20 nm, less than about 10 nm, or less than about 5 nm. A second electrode 700 may be formed on the sixth insulating layer 650. The second electrode 700 may be electrically connected to the light emitting element LE1 through a second conductive plug CP20. The second electrode 700 and the second conductive plug CP20 may correspond to the second electrode E20 and the second conductive plug CP20 of FIGS. 3A and 3B.

Figure 36:
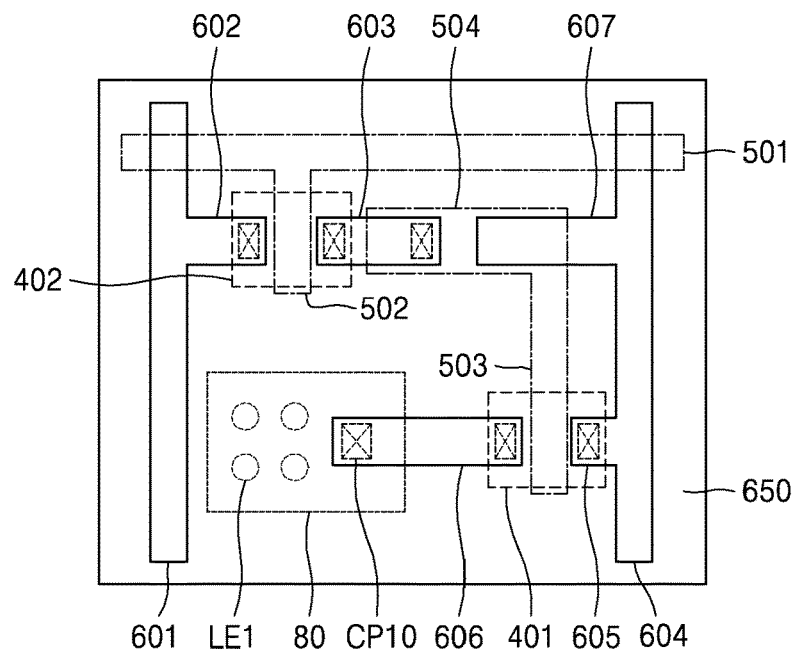
FIGS. 36 and 37 are plan views illustrating a method of forming a transistor array in a method of manufacturing a display apparatus, according to another exemplary embodiment.
Figure 37:
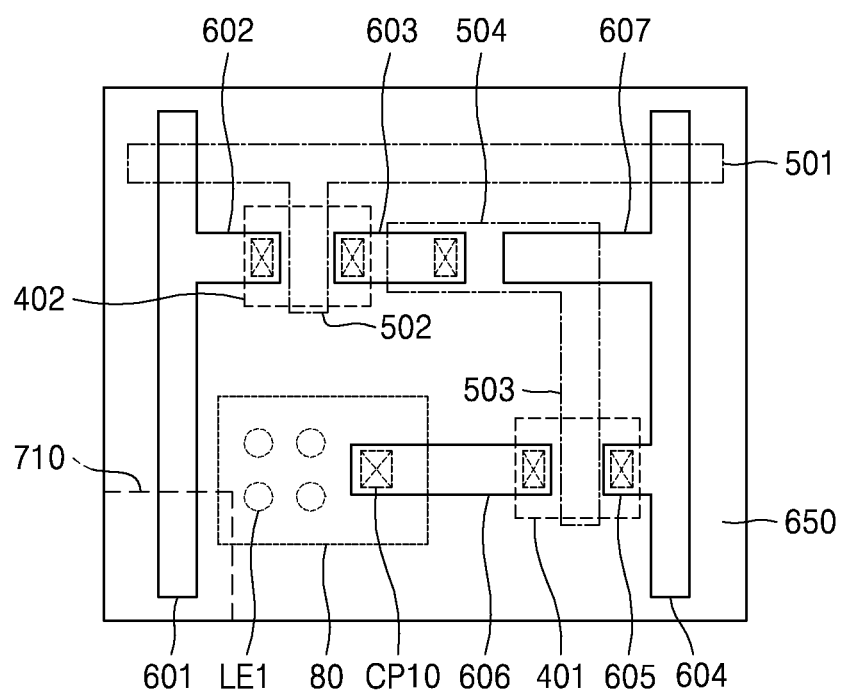

FIGS. 36 and 37 are plan views illustrating a method of forming a transistor array in a method of manufacturing a display apparatus according to another exemplary embodiment.

Referring to FIG. 36, a device portion having the same structure as in FIG. 34 may be formed. In the present exemplary embodiment, the material of the substrate may be a semiconductor or a conductor. Then, a sixth insulating layer 650 covering a plurality of light emitting elements and a plurality of transistors may be formed on the substrate.

Referring to FIG. 37, a second electrode 710 may be formed at a bottom surface (rear surface) of the substrate. The second electrode 710 may be electrically connected to the light emitting element LE1 through the substrate. The second electrode 710 may correspond to the second electrode E22 of FIGS. 4A and 4B.

FIGS. 38 to 41 are cross-sectional views illustrating a method of forming a color control member in a method of manufacturing a display apparatus according to an exemplary embodiment.

Figure 38:
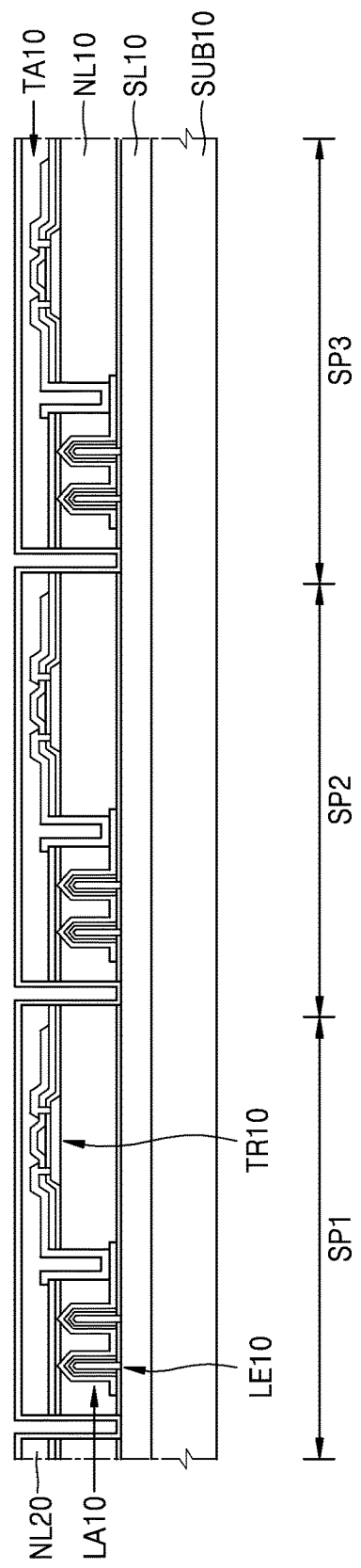
FIGS. 38 to 41 are cross-sectional views illustrating a method of forming a color control member in a method of manufacturing a display apparatus, according to an exemplary embodiment.

Referring to FIG. 38, a light emitting element array LA10 including a plurality of light emitting elements LE10 and a transistor array TA10 including a plurality of transistors TR10 may be provided on a substrate SUB10. The substrate SUB10, the light emitting element array LA10, and the transistor array TA10 may be the same as those described with reference to FIG. 1. In the present exemplary embodiment, the plurality of light emitting elements LE10 may be blue light emitting elements (e.g., blue LEDs).

Figure 39:
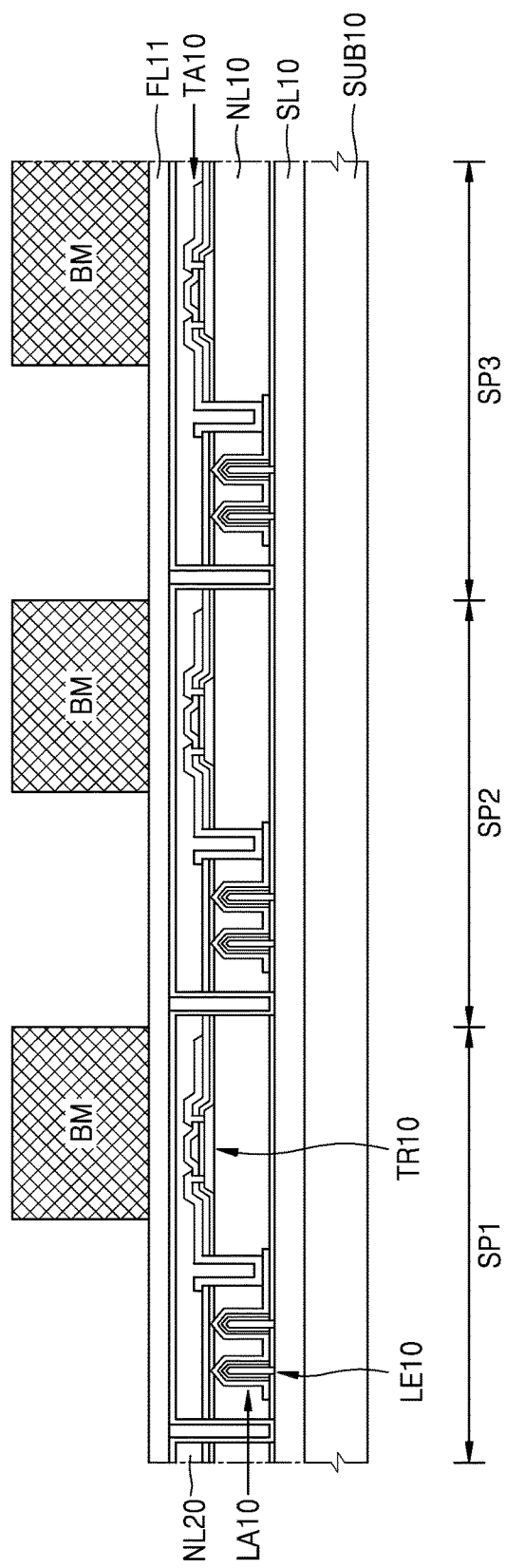

Referring to FIG. 39, a first optical film FL11 may be formed on the light emitting element array LA10 and the transistor array TA10. The first optical film FL11 may be, for example, a yellow recycling film (YRF). The YRF may transmit blue wavelengths and may reflect green wavelengths and red wavelengths.

Thereafter, a black matrix pattern BM may be formed on the first optical film FL11. The black matrix pattern BM may be disposed above the transistor TR10.

Figure 40:
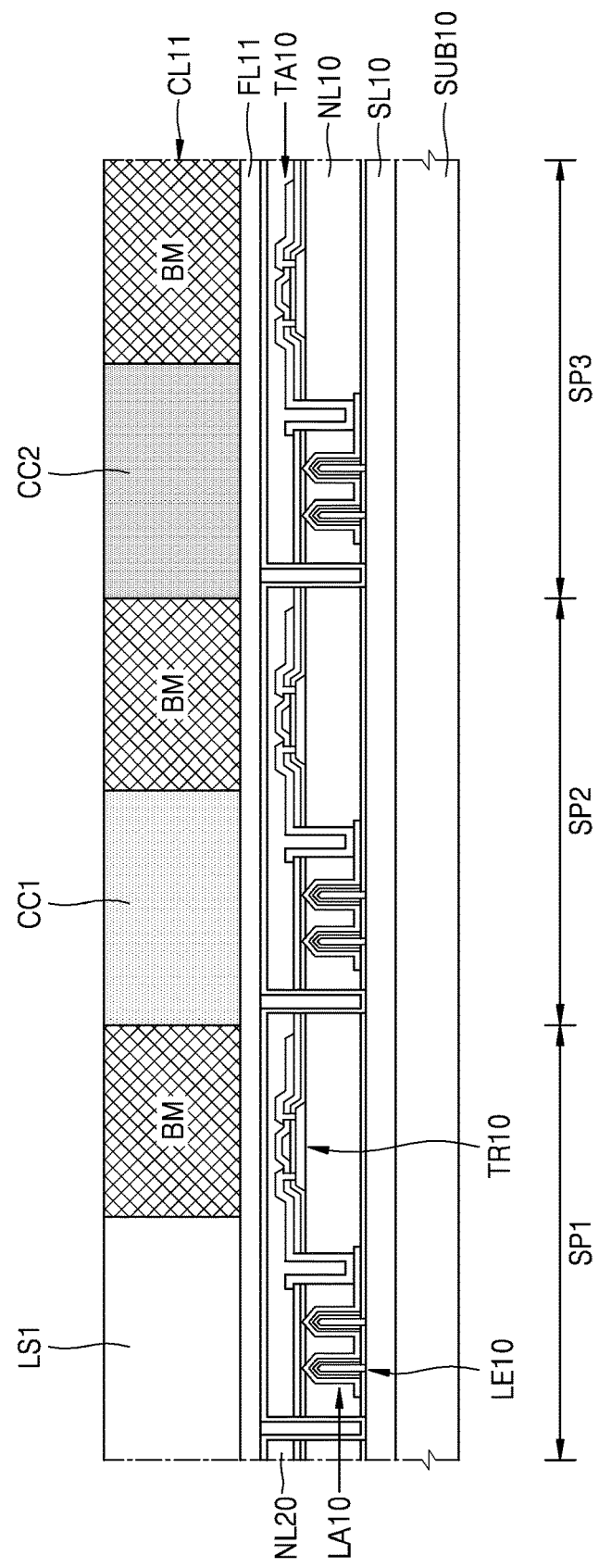

Referring to FIG. 40, color converting elements CC1 and CC2 may be formed in spaces defined by the black matrix pattern BM. For example, a blue-to-green color converting element CC1 may be formed in a region corresponding to a second subpixel SP2, and a blue-to-red color converting element CC2 may be formed in a region corresponding to a third subpixel SP3. Also, a light scattering element LS1 may be formed in a region corresponding to a first subpixel SP1. The blue-to-green color converting element CC1 may include a photoresist (PR), a first quantum dot (QD), and a light scattering agent, and the blue-to-red color converting element CC2 may include a photoresist (PR), a second quantum dot (QD), and a light scattering agent. The light scattering element LS1 may include a photoresist (PR) and a light scattering agent. The color converting elements CC1 and CC2 and the light scattering element LS1 may be formed by using a negative photoresist process used in a conventional semiconductor process.

Figure 41:
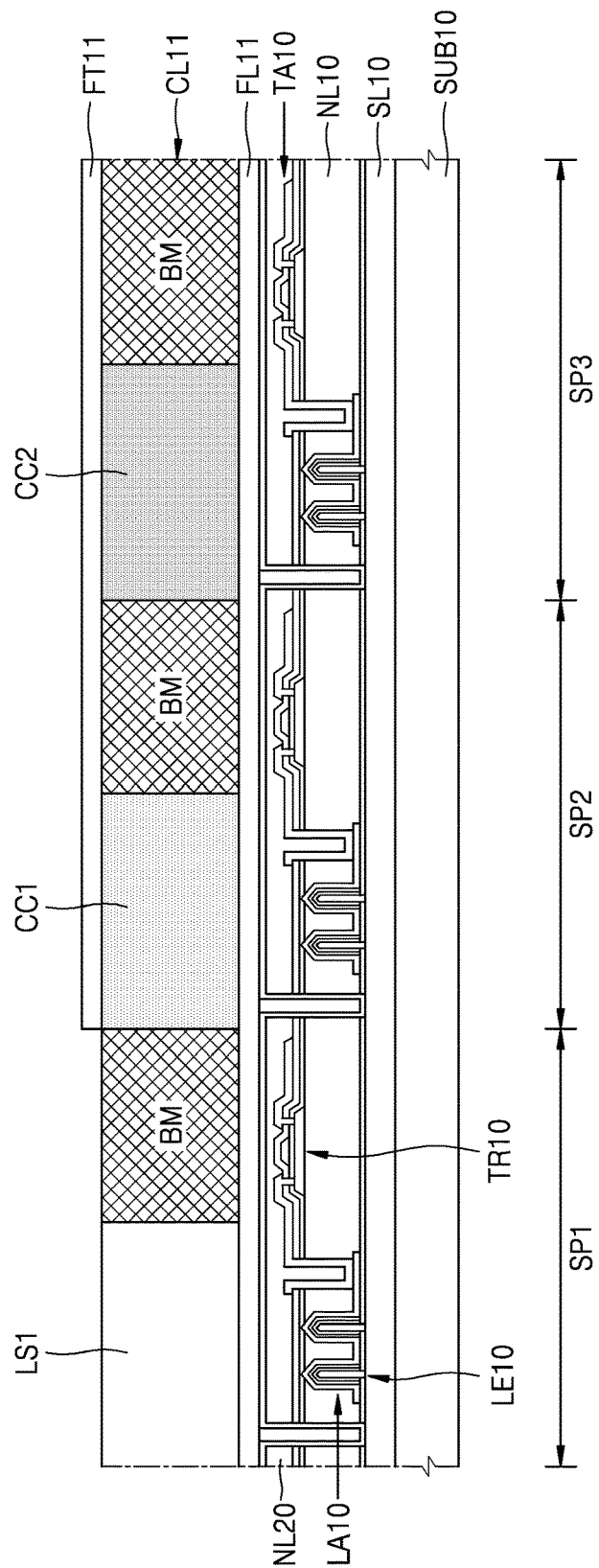

Referring to FIG. 41, a second optical film FT11 may be formed on the color control member CL11. The second optical film FT11 may be formed to cover the blue-to-green color converting element CC1 and the blue-to-red color converting element CC2, and may not cover the light scattering element LS1. The second optical film FT11 may be a blue cut filter (BCF). The BCF may not transmit blue wavelengths (about 400 nm to about 500 nm) and may transmit only wavelength bands other than a blue wavelength band.

The apparatus of FIG. 41 may correspond to the apparatus of FIG. 11. If the plurality of light emitting elements LE10 are white light emitting elements, a color control member CL12 as in FIG. 12 may be formed to implement a full-color display. In addition, the formation method and the configuration of the color control member may be modified in any of various ways according to the arrangement method and the combination of subpixels and the light emission color of light emitting elements.

Also, although FIGS. 31 to 41 illustrate a case in which a display apparatus is manufactured by using the structure of FIGS. 22(A) and 22(B) as a base structure, a display apparatus may be manufactured by using the structure of FIGS. 26(A) and 26(B) or FIG. 30 as a base structure. This may be easily known by those of ordinary skill in the art, and thus detailed descriptions thereof will be omitted for conciseness.

Also, as described with reference to FIGS. 15 and 16, an active region, a scan driver, a data driver, an image signal processor, and a communication part may be monolithically formed on one substrate. Thus, the display apparatuses according to exemplary embodiments may have an almost fully monolithic configuration or a fully monolithic configuration.

Although many details have been described above, they are not intended to limit the scope of the inventive concept, but should be interpreted as merely exemplary embodiments. For example, those of ordinary skill in the art will understand that the configurations of the light emitting elements, the light emitting element arrays, the transistors, the transistor arrays, the driving units including the transistor arrays, and the color control members, and the connection relationships therebetween, which have been described above with reference to FIGS. 1 to 12, may be modified in any of various ways. As a particular example, those of ordinary skill in the art will understand that the transistor may have a bottom-gate structure, not a top-gate structure, the light emitting element may have a general LED structure, and the relative position and the connection relationship between the light emitting element and the transistor corresponding thereto may vary according to embodiments. Also, those of ordinary skill in the art will understand that the light emitting element manufacturing methods, the transistor manufacturing methods, the color control member manufacturing methods, and the display apparatus manufacturing methods using the same, which have been described above with reference to FIGS. 17 to 41, may be modified in any of various ways. In addition, those of ordinary skill in the art will understand that the application fields of the display apparatuses according to the exemplary embodiments may be modified in any of various ways. Therefore, the scope of the inventive concept should be defined not by the described exemplary embodiments but by the spirit and scope described in the following claims.

It should be understood that exemplary embodiments described herein should be considered in a descriptive sense only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate;
a first layered structure provided on the substrate and comprising an array of a plurality of light emitting elements, each comprising an inorganic material;
a second layered structure comprising an array of a plurality of transistors electrically connected to the plurality of light emitting elements; and
a third layered structure comprising a color control member disposed such that light output from the plurality of light emitting elements is incident thereon and configured to control a color of light transmitted therefrom,
wherein the second layered structure is between the first layered structure and the third layered structure and all of the first layered structure, the second layered structure and the third layered structure are monolithically provided on the substrate.

2. The display apparatus of claim 1, wherein
the plurality of light emitting elements comprise a plurality of vertical nanostructures perpendicular to the substrate, and
each of the plurality of vertical nanostructures has a core-shell structure comprising a first conductivity type semiconductor, an active layer, and a second conductivity type semiconductor.

3. The display apparatus of claim 2, wherein each of the plurality of vertical nanostructures comprises a nanowire structure.

4. The display apparatus of claim 2, wherein each of the plurality of vertical nanostructures comprises a nanopyramid structure.

5. The display apparatus of claim 2, wherein each of the plurality of vertical nanostructures comprises a nanowire portion and a nanopyramid portion provided on the nanowire portion.

6. The display apparatus of claim 5, wherein
the nanowire portion has a width of about 600 nm or less and a height of about 1 μm or more, and
the nanopyramid portion has a width larger than the width of the nanowire portion.

7. The display apparatus of claim 2, wherein at least one of the first conductivity type semiconductor, the active layer, and the second conductivity type semiconductor comprises a gallium nitride (GaN)-based material.

8. The display apparatus of claim 1, wherein each of the plurality of transistors is spaced apart from a light emitting element corresponding thereto in a direction parallel to the substrate, such that the plurality of transistors do not overlap with the plurality of light emitting elements.

9. The display apparatus of claim 1, further comprising:
a first electrode, electrically contacting a first group of light emitting elements from among the plurality of light emitting elements, provided on the substrate;
a first insulating layer, covering the first electrode and the first group of light emitting elements, provided on the substrate, wherein the plurality of transistors are provided on the first insulating layer;
a second insulating layer, covering the plurality of transistors and the plurality of light emitting elements, provided on the first insulating layer;
a second electrode, electrically connected to the plurality of light emitting elements, provided on the second insulating layer;
a first conductive plug which penetrates the first insulating layer and connects the first electrode to one of the plurality of transistors; and
a second conductive plug which penetrates the first insulating layer and the second insulating layer and connects the second electrode to the plurality of light emitting elements.

10. The display apparatus of claim 1, further comprising:
a first electrode, electrically contacting a first group of light emitting elements from among the plurality of light emitting elements, provided at a top surface of the substrate;
a first insulating layer, covering the first electrode and the first group of light emitting elements, provided at the top surface of the substrate; wherein the plurality of transistors are provided on the first insulating layer;
a first conductive plug, which penetrates the first insulating layer and connects the first electrode to one of the plurality of transistors; and
a second electrode, electrically connected to the plurality of light emitting elements, provided at a bottom surface of the substrate.

11. The display apparatus of claim 1, wherein
the display apparatus comprises a plurality of unit regions, and
each of the plurality of unit regions comprises a 2T (transistor)-1C (capacitor) configuration.

12. The display apparatus of claim 1, wherein
the display apparatus comprises a plurality of unit regions, and
each of the plurality of unit regions comprises a combination of at least three of the plurality of transistors and at least one capacitor.

13. The display apparatus of claim 12, wherein
each of the plurality of unit regions comprises a 4T (transistor)-2C (capacitor) configuration.

14. The display apparatus of claim 1, wherein
the display apparatus comprises a plurality of unit regions, and
each of the plurality of unit regions comprises:
a scan line;
a data line intersecting the scan line;
a voltage source line spaced apart from the data line;
a first transistor, of the plurality of transistors, provided at an intersection between the scan line and the data line;
a second transistor, of the plurality of transistors, connected between the voltage source line and a first group of the plurality of light emitting elements; and
a capacitor connected between the voltage source line and the first and second transistors.

15. The display apparatus of claim 1, wherein the display apparatus further comprises:
a plurality of unit regions,
a driving transistor connected to one of the plurality of unit regions; and
a capacitor connected to the one of the plurality of unit regions,
wherein the driving transistor comprises a gate electrode extending in a first direction, and
wherein the capacitor comprises a conductive layer extending from an end portion of the gate electrode in a second direction perpendicular to the first direction.

16. The display apparatus of claim 1, wherein
the second layered structure further comprises an insulating layer covering the plurality of light emitting elements and the plurality of transistors,
the insulating layer has a substantially flat surface,
the third layered structure is provided on the substantially flat surface of the insulating layer, and
the third layered structure has a substantially flat layer structure.

17. The display apparatus of claim 16, further comprising:
a yellow recycling film (YRF) provided between the second layered structure and the third layered structure; and
a blue cut filter (BCF) provided on the third layered structure,
wherein each of the YRF and the BCF has a substantially flat layer structure.

18. The display apparatus of claim 1, wherein
the plurality of light emitting elements comprise a first group of blue light emitting elements corresponding to a first subpixel, a second group of blue light emitting elements corresponding to a second subpixel, and a third group of blue light emitting elements corresponding to a third subpixel, and
the color control member comprises a blue-to-green color converting element corresponding to the second subpixel and a blue-to-red color converting element corresponding to the third subpixel.

19. The display apparatus of claim 18, wherein the color control member further comprises a light scattering element corresponding to the first subpixel.

20. The display apparatus of claim 18, further comprising:
a yellow recycling film (YRF) provided between the second layered structure and the third layered structure; and
a blue cut filter (BCF) provided on the third layered structure and covering the blue-to-green color converting element and the blue-to-red color converting element.

21. The display apparatus of claim 1, wherein
the display apparatus comprises an active region comprising the plurality of light emitting elements, the plurality of transistors, and the color control member and further comprises a scan driver connected to the active region and a data driver connected to the active region, and
all of the active region, the scan driver, and the data driver are monolithically provided on the substrate.

22. The display apparatus of claim 21, wherein
the display apparatus further comprises an image signal processor and a communication part, and
both the image signal processor and the communication part are monolithically provided on the substrate together with the active region, the scan driver, and the data driver.

23. The display apparatus of claim 1, wherein the display apparatus is a micro-display apparatus having a size of about 6 inches or less.

24. A display apparatus comprising:
a light emitting element array provided on a substrate and comprising a plurality of light emitting elements, each comprising an inorganic material;
a transistor array comprising a plurality of transistors electrically connected to the plurality of light emitting elements;
a color control member configured to adjust a color of light generated by the plurality of light emitting elements;
a first optical film, disposed such that the light output from the plurality of light emitting elements is incident thereon and configured to transmit, to the color control member, a light of a first wavelength band and reflect a light of a second wavelength band; and
a second optical film, facing the first optical film with the color control member therebetween, configured to block the light of the first wavelength band and transmit the light of the second wavelength band, wherein the light emitting element array, the transistor array, the first optical film, the color control member, and the second optical film are monolithically provided on the substrate, thereby forming a monolithic device.

25. The display apparatus of claim 24, wherein
the display apparatus comprises a first layered structure comprising the light emitting element array, a second layered structure comprising the transistor array, and a third layered structure comprising the color control member, and
the second layered structure is between the first layered structure and the third layered structure.

26. The display apparatus of claim 25, wherein
the first optical film is provided between the second layered structure and the third layered structure, and
the third layered structure is provided between the first optical film and the second optical film.

27. The display apparatus of claim 25, wherein
the second layered structure has a substantially flat surface, and
the first optical film, the third layered structure, and the second optical film are provided on the flat surface.

28. The display apparatus of claim 24, wherein
the plurality of light emitting elements comprise a first group of blue light emitting elements corresponding to a first subpixel, a second group of blue light emitting elements corresponding to a second subpixel, and a third group of blue light emitting elements corresponding to a third subpixel, and
the color control member comprises a light scattering element corresponding to the first subpixel, a blue-to-green color converting element corresponding to the second subpixel, and a blue-to-red color converting element corresponding to the third subpixel.

29. The display apparatus of claim 28, wherein
the first optical film comprises a yellow recycling film (YRF),
the second optical film comprises a blue cut filter (BCF), and
the BCF covers the blue-to-green color converting element and the blue-to-red color converting element.

30. The display apparatus of claim 24, wherein
each of the plurality of light emitting elements comprises a vertical nanostructure perpendicular to the substrate, and
the vertical nanostructure has a core-shell structure comprising a first conductivity type semiconductor, an active layer, and a second conductivity type semiconductor.

31. The display apparatus of claim 30, wherein the vertical nanostructure comprises one of a nanowire and a combination of a nanowire and a nanopyramid.

32. The display apparatus of claim 24, further comprising:
a first electrode, electrically contacting a first group of light emitting elements from among the plurality of light emitting elements, provided on the substrate;
a first insulating layer, covering the first electrode and the first group of light emitting elements, provided on the substrate, wherein the plurality of transistors are provided on the first insulating layer;
a second insulating layer, covering the plurality of transistors and the plurality of light emitting elements, provided on the first insulating layer;
a second electrode, electrically connected to the plurality of light emitting elements, provided on the second insulating layer;
a first conductive plug, penetrating the first insulating layer and connecting the first electrode to one of the plurality of transistors; and
a second conductive plug, penetrating the first insulating layer and the second insulating layer and connecting the second electrode to the plurality of light emitting elements.

33. The display apparatus of claim 24, further comprising:
a first electrode, electrically contacting a first group of light emitting elements from among the plurality of light emitting elements, provided on a top surface of the substrate;
a first insulating layer, covering the first electrode and the first group of light emitting elements, provided on the top surface of the substrate, wherein the plurality of transistors are provided on the first insulating layer;
a first conductive plug, penetrating the first insulating layer and connecting the first electrode to one of the plurality of transistors; and
a second electrode, electrically connected to the plurality of light emitting elements, provided at a bottom surface of the substrate.

34. The display apparatus of claim 24, wherein
the display apparatus comprises a plurality of unit regions, and
each of the plurality of unit regions comprises one of a 2T (transistor)-1C (capacitor) configuration and a 4T-2C configuration.

35. An electronic apparatus comprising the display apparatus of claim 1.

36. The electronic apparatus of claim 35, wherein the electronic apparatus comprises one of a wearable apparatus and a portable apparatus.

37. The electronic apparatus of claim 35, wherein the electronic apparatus comprises one of an augmented reality (AR) display, a virtual reality (VR) display, and a projection display.

38. A light emitting device comprising at least one vertical light emitting structure, the at least one vertical light emitting structure comprising:
a first conductivity type semiconductor comprising a first portion perpendicular to a substrate and a second portion disposed on the first portion, wherein the first portion has a first width and the second portion has a second width larger than the first width;
an active layer covering the second portion of the first conductivity type semiconductor;
a second conductivity type semiconductor covering the active layer;
a first insulating layer covering the first portion and extending from a bottom of the first portion to a top of the second portion;
an electrode covering the second conductivity type semiconductor; and
a second insulating layer covering the electrode and extending from a bottom of the second portion to a top of the second portion.

39. The light emitting device of claim 38, wherein
the first portion comprises a nanowire, and
the second portion comprises a nanopyramid.

40. The light emitting device of claim 38, wherein the first width is about 600 nm or less and the first portion has a height of about 1 μor more.

41. The light emitting device of claim 38, wherein a surface of the second portion comprises a (10-11) s-plane.

42. The light emitting device of claim 38, wherein the at least one vertical light emitting structure comprises:

a core portion comprising the first conductivity type semiconductor, and a shell comprising the active layer and the second conductivity type semiconductor.

43. The light emitting device of claim 38, wherein at least one of the first conductivity type semiconductor, the active layer, and the second conductivity type semiconductor comprises a III-V group-based semiconductor.

44. A method of manufacturing a display apparatus, the method comprising:

forming a first layered structure on a substrate, the first layered structure comprising a plurality of light emitting elements;

forming a second layered structure on the first layered structure, the second layered structure comprising a plurality of transistors electrically connected to the plurality of light emitting elements; and forming a third layered structure on the second layered structure, the third layered structure comprising a color control member configured to control a color of light transmitted therefrom, wherein the forming the third layered structure comprises forming the color control member such that light output from the plurality of light emitting elements is incident thereon:

wherein all of the first layered structure, the second layered structure and the third layered structure are monolithically formed on the substrate.

* * * * *